(12) United States Patent
Pereira

(10) Patent No.: US 11,807,220 B1
(45) Date of Patent: Nov. 7, 2023

(54) METHOD FOR CAPTURING VOLTAGE-BASED EVENTS IN MOTOR VEHICLES

(71) Applicant: Geotab Inc., Oakville (CA)

(72) Inventor: Fábio Pereira, London (CA)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 18/211,337

(22) Filed: Jun. 19, 2023

Related U.S. Application Data

(60) Provisional application No. 63/469,622, filed on May 30, 2023.

(51) Int. Cl.
*B60W 20/40* (2016.01)
*B60W 50/14* (2020.01)
*B60W 10/08* (2006.01)

(52) U.S. Cl.
CPC ............ *B60W 20/40* (2013.01); *B60W 10/08* (2013.01); *B60W 50/14* (2013.01); *B60W 2556/55* (2020.02)

(58) Field of Classification Search
None
See application file for complete search history.

(56) References Cited

U.S. PATENT DOCUMENTS

| | | | |
|---|---|---|---|
| 6,512,466 B2 * | 1/2003 | Flick | G08G 1/127 342/357.75 |
| 6,819,269 B2 * | 11/2004 | Flick | B60R 25/102 340/988 |
| 7,312,696 B2 | 12/2007 | Flick | |
| 9,342,933 B2 | 5/2016 | Olsen, III et al. | |
| 10,012,201 B1 | 7/2018 | Chen | |
| 10,173,547 B1 | 1/2019 | Denson | |
| 10,197,631 B2 | 2/2019 | Barfield, Jr. et al. | |
| 11,378,625 B2 | 7/2022 | Alleva et al. | |
| 11,577,739 B1 * | 2/2023 | Walli | H04W 52/028 |
| 11,578,978 B1 * | 2/2023 | Hickey | H04W 4/027 |
| 11,586,270 B1 * | 2/2023 | Walli | H04W 52/0254 |
| 2009/0326841 A1 | 12/2009 | Zhang et al. | |
| 2010/0002307 A1 | 1/2010 | Yamamura | |
| 2010/0023207 A1 | 1/2010 | Maeda et al. | |
| 2011/0082621 A1 | 4/2011 | Berkobin et al. | |
| 2017/0108552 A1 | 4/2017 | Roumi et al. | |
| 2019/0025379 A1 | 1/2019 | Pajovic et al. | |
| 2019/0324092 A1 | 10/2019 | Sabina | |
| 2020/0294333 A1 | 9/2020 | Aiello et al. | |
| 2021/0255247 A1 | 8/2021 | Alleva et al. | |
| 2021/0318692 A1 | 10/2021 | Lloyd et al. | |
| 2022/0026492 A1 | 1/2022 | Verheijen et al. | |
| 2022/0043066 A1 | 2/2022 | Lloyd et al. | |

FOREIGN PATENT DOCUMENTS

EP 1396729 B1 12/2012

* cited by examiner

*Primary Examiner* — Abdhesh K Jha
(74) *Attorney, Agent, or Firm* — Sherif A. Abdel-Kader

(57) ABSTRACT

A method in a telematics device capable of detecting and capturing both cranking and operating events is provided. The method configures the telematics device to use the same components to detect operating voltage for either electric or combustion vehicles, and to detect and facilitate capturing cranking events.

20 Claims, 18 Drawing Sheets

METHOD FOR CAPTURING VOLTAGE-BASED EVENTS IN MOTOR VEHICLES

RELATED APPLICATIONS

This application claims priority from U.S. provisional patent application 63/469,622 file on May 30 2023 the contents of which are herein incorporated by reference in their entirety.

FIELD

The present disclosure generally relates to machine telematics, and more specifically to a method for capturing voltage-based events in motor vehicles.

BACKGROUND

A telematics system may gather asset data using a telematics device. The telematics device may be integrated into or located onboard the asset. The asset may be a vehicle ("vehicular asset") or some stationary equipment. The telematics device may collect the asset data from the asset through a data connection with the asset. In the case of a vehicular asset, the telematics device may gather the asset data through an onboard diagnostic port (OBD). The gathered asset data may include engine revolutions-per-minute (RPM), battery voltage, fuel level, tire pressure, oil temperature, or any other asset data available through the diagnostic port. Additionally, the telematics device may gather sensor data pertaining to the asset via sensors on the telematics device. For example, the telematics device may have temperature and pressure sensors, inertial measurement units (IMU), optical sensors, and the like. Furthermore, the telematics device may gather location data pertaining to the asset from a location module on the telematics device. When the telematics device is coupled to the asset, the gathered sensor data and location data pertain to the asset. The gathered asset data, sensor data and location data may be received and recorded by a technical infrastructure of the telematics system, such as a telematics server, and used in the provision of fleet management tools, for telematics services, or for further data analysis.

SUMMARY

In one aspect of the present disclosure, there is provided a method in a telematics device coupled to a vehicle including a battery. The method comprises determining that a vehicle type of the vehicle is one of: an electric vehicle (EV), an internal combustion engine vehicle (ICEV), and an unknown type. In response to determining that the vehicle type is an unknown type or is an EV, the method further comprises comparing by a comparator a battery voltage of the battery with a charging threshold. In response to determining that the battery voltage is above the charging threshold, when the vehicle type is an unknown type, the method further comprises querying the vehicle for the vehicle type and saving the vehicle type. In response to determining that the vehicle type is an ICEV, the method further comprises comparing by the comparator the battery voltage with a cranking threshold. In response to determining that the battery voltage is below the cranking threshold, the method further comprises capturing a plurality of cranking voltage values and checking for at least one indicator that indicates that the vehicle is turned on.

Determining that the vehicle type is one of: an EV, an ICEV, and an unknown type may comprise checking a stored vehicle type in a non-volatile storage of the telematics device.

Determining that the vehicle type is an unknown type or is an EV may comprise determining that the vehicle type is an unknown type. The charging threshold may comprise a default charging threshold.

Determining that the vehicle type is an unknown type or is an EV may comprise determining that the vehicle type is EV. The charging threshold may comprise an EV charging threshold.

The battery voltage may be represented by a voltage monitor output of a voltage monitor coupled to the battery.

The voltage monitor output may be connected to a first input of the comparator.

Comparing the battery voltage with the charging threshold may comprise outputting by a processing unit a digital signal corresponding to the charging threshold to a digital-to-analog converter (DAC) for converting the digital signal to an analog signal corresponding to the charging threshold, outputting the analog signal of the DAC to a second input of the comparator, and configuring the processing unit to generate a first interrupt event upon detecting a first logic transition in an output of the comparator.

The first input may comprise a non-inverting input, and the second input may comprise an inverting input.

The first logic transition may comprise one of a logic transition from a logic low state to a logic high state and a rising edge transition.

The first input may comprise an inverting input and the second input may comprise a non-inverting input.

The first logic transition may comprise one of a logic transition from a logic low state to a logic high state and a rising edge transition.

Determining that the battery voltage is above the charging threshold may comprise detecting the first interrupt event.

Querying the vehicle for the vehicle type may comprise querying at least one electronic control unit (ECU) of the vehicle.

Saving the vehicle type comprises writing the vehicle type in a non-volatile storage of the telematics device.

Determining that the vehicle type is an ICEV may comprise checking a stored vehicle type in a non-volatile storage of the telematics device.

Comparing the battery voltage with the cranking threshold may comprise outputting by a processing unit a digital signal corresponding to the cranking threshold to a digital-to-analog converter (DAC) for converting the digital signal to an analog signal corresponding to the charging threshold, outputting the analog signal from the DAC to a second input of the comparator, and configuring the processing unit to generate a second interrupt event upon detecting a second logic transition in an output of the comparator.

The first input may comprise a non-inverting input, and the second input comprises an inverting input.

The second logic transition may comprise one of a transition from a logic high state to a logic low state and a falling edge transition.

Determining that the battery voltage is below the cranking threshold may comprise detecting the second interrupt event.

Capturing the plurality of voltage values may comprise sampling a digital output of an analog-to-digital converter (ADC) having an analog input coupled to the voltage monitor output.

Sampling the digital output may be done for a predetermined cranking duration.

Sampling the digital output may be done until a sampled voltage value of the digital output is greater or equal to the charging threshold.

The method may further comprise clearing the vehicle type in response to detecting a new installation of the telematics device in the vehicle.

The method may further comprise transmitting the plurality of cranking voltage values to a remote server.

In another aspect of the present disclosure, there is provided a telematics device couplable with a vehicle including a battery. The telematics device comprises a main controller and an auxiliary controller coupled with the main controller via a controller interconnect. The auxiliary controller comprises a central processing unit (CPU), an analog comparator coupled to the CPU, a digital to analog converter (DAC) coupled at an input thereof to the CPU and having an output connected to an input of the analog comparator, an analog to digital converter (ADC) having an input couplable to a voltage monitor output and having an output coupled to the CPU, and a non-volatile memory coupled to the CPU. The non-volatile memory stores firmware comprising machine-executable programming instructions which when executed by the CPU configure the telematics device to carry out the steps of the preceding aspect.

The machine-executable programming instructions when executed by the CPU configure the telematics device to determine that a vehicle type of the vehicle is one of: an electric vehicle (EV), an internal combustion engine vehicle (ICEV), and an unknown type. In response to determining that the vehicle type is an unknown type or is an EV, the machine-executable programming instructions further configure the telematics device to compare by the analog comparator a battery voltage of the battery with a charging threshold. In response to determining that the battery voltage is above the charging threshold, the machine-executable programming instructions further configure the telematics device to query the vehicle for the vehicle type and save the vehicle type, when the vehicle type is an unknown type. In response to determining that the vehicle type is an ICEV, the machine-executable programming instructions further configure the telematics device to compare by the analog comparator the battery voltage with a cranking threshold. In response to determining that the battery voltage is below the cranking threshold, the machine-executable programming instructions further configure the telematics device to capture a plurality of cranking voltage values and check for at least one indicator that indicates that the vehicle is turned on.

BRIEF DESCRIPTION OF THE DRAWINGS

Exemplary non-limiting embodiments of the present invention are described with reference to the accompanying drawings in which.

DETAILED DESCRIPTION

Telematics System

Figure 1:
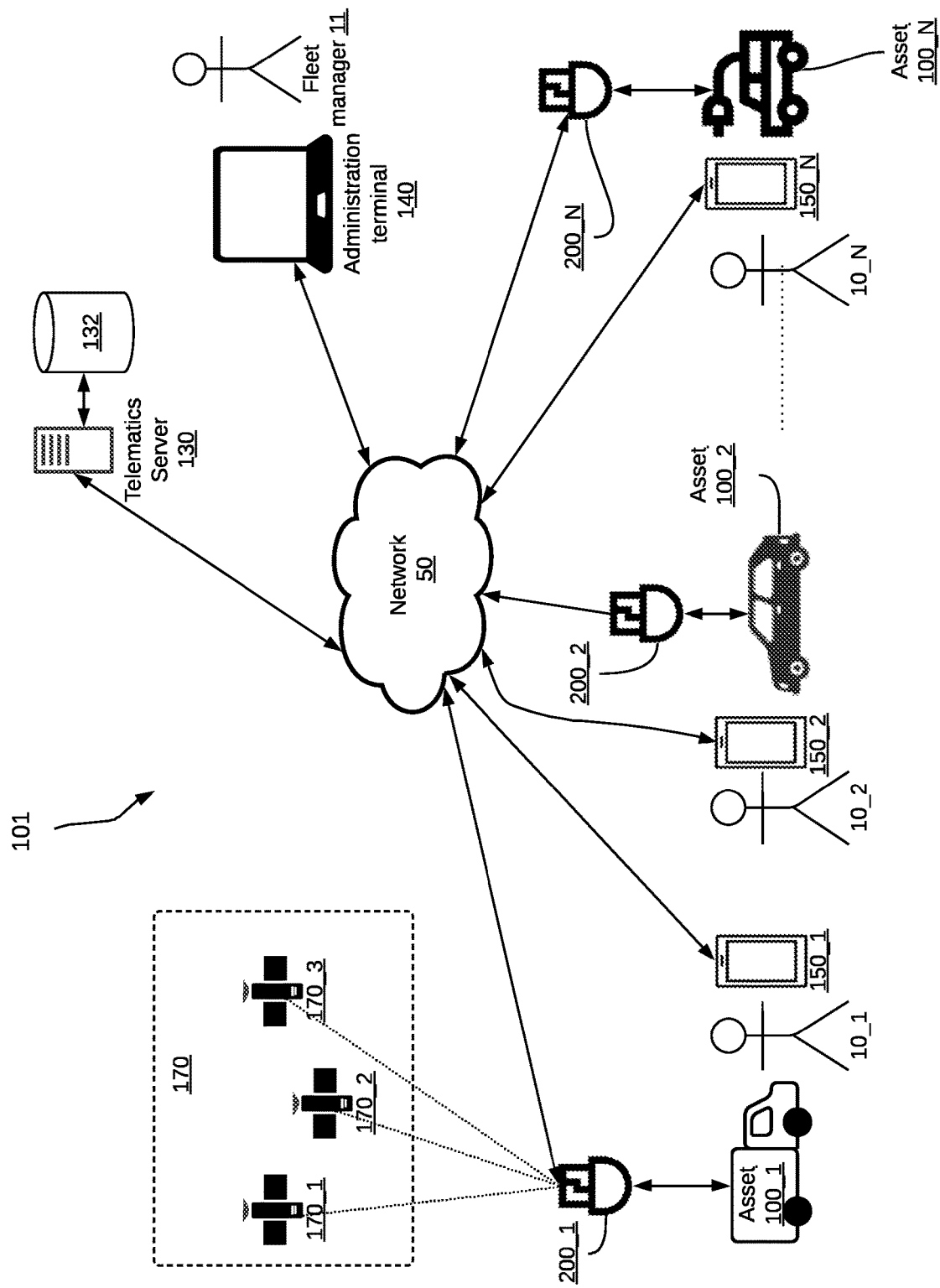
FIG. 1 is a schematic diagram of a telematics system including a plurality of telematics devices coupled to a plurality of assets.

A large telematics system may collect data from a high number of assets, either directly or through telematic devices. A telematics device may refer to a self-contained device installed at an asset, or a telematics device that is integrated into the asset itself. In either case, it may be said that telematics data is being captured or gathered by the telematics device. FIG. 1 shows a high-level block diagram of a telematics system 101. The telematics system 101 includes a telematics server 130, (N) telematics devices shown as telematics device 200_1, telematics device 200_2 . . . through telematics device 200_N ("telematics device 200"), a network 50, administration terminal 140, and operator terminals 150_1, 150_2 . . . through 150_N ("the operator terminals 150"). FIG. 1 also shows a plurality of (N) assets named as asset 100_1, asset 100_2 . . . asset 100_N ("asset 100") coupled to the telematics device 200_1, telematics device 200_2 . . . telematics device 200_N, respectively. Additionally, FIG. 1 shows a plurality of satellites 170_1, 170_2 and 170_3 ("the satellites 170") in communication with the telematics devices 200 for facilitating navigation.

The assets 100 shown are in the form of vehicles. For example, the asset 100_1 is shown as a truck, which may be part of a fleet that delivers goods or provides services. The asset 100_2 is shown as a passenger car that typically runs on an internal combustion engine (ICE), hereinafter referred to as an internal combustion engine vehicle or an "ICEV". The asset 100_3 is shown as an electric vehicle (EV). Other types of vehicles, which are not shown, are also contemplated in the various embodiments of the present disclosure, including but not limited to, farming vehicles, construction vehicles, military vehicles, and the like.

The telematics devices 200 are electronic devices which are coupled to assets 100 and configured to capture asset data from the assets 100. For example, in FIG. 1 the telematics device 200_1 is coupled to the asset 100_1. Similarly, the telematics device 200_2 is coupled to the asset 100_2 and the telematics device 200_3 is coupled to the asset 100_3. The components of a telematics device 200 are explained in further detail with reference to FIG. 2.

The network 50 may be a single network or a combination of networks such as a data cellular network, the Internet, and other network technologies. The network 50 may provide connectivity between the telematics devices 200 and the telematics server 130, between the administration terminal 140 and the telematics server 130, and between the operator terminals 150 and the telematics server 130.

The telematics server 130 is an electronic device executing machine-executable programming instructions which enable the telematics server 130 to store and analyze telematics data. The telematics server 130 may be a single computer system or a cluster of computers. The telematics server 130 may be running an operating system such as Linux, Windows, Unix, or any other equivalent operating system. Alternatively, the telematics server 130 may be a software component hosted on a cloud service, such as Amazon Web Service (AWS). The telematics server 130 is connected to the network 50 and may receive telematics data from the telematics devices 200 in a secure manner over the network 50. For example, the telematics device 200 may establish a secure, encrypted channel with the telematics server 130 to securely send telematics data to the telematics server 130. The telematics server 130 may have a plurality of software modules for performing data analysis and analytics on the telematics data to obtain useful asset information about the assets 100. The telematics server 130 may be coupled to a telematics database 132 for storing telematics data and/or the results of the analytics which are related to the assets 100. The asset information stored may include operator information about the operators 10 corresponding to the assets. The telematics server 130 may communicate the asset data and/or the operator information pertaining to an asset 100 to one or more of: the administration terminal 140, and the operator terminal 150.

The satellites 170 may be part of a global navigation satellite system (GNSS) and may provide location information to the telematics devices 200. The location information may be processed by a location module on the telematics device 200 to provide location data indicating the location of the telematics device 200 (and hence the location of the asset 100 coupled thereto). A telematics device 200 that can periodically report an asset's location is often termed an "asset tracking device".

The administration terminal 140 is an electronic device, which may be used to connect to the telematics server 130 to retrieve data and analytics related to one or more assets 100 or to issue commands to one or more telematics device 200 via the telematics server 130. The administration terminal 140 is shown as a laptop computer, but may also be a desktop computer, a tablet (not shown), or a smartphone. The administration terminal 140 may run a web browser or a custom application which allows securely retrieving data and analytics, pertaining to one or more assets 100, from the telematics server 130 via a web interface of the telematics server 130. For example, the administrative terminal 140 may open a secure hypertext transfer protocol (HTTPS) connection to the telematics server 130 for securely retrieving data and analytics from the telematics server 130. The administration terminal 140 may also be used to issue commands to one or more telematics device 200 via the telematics server 130. A fleet manager 11 may communicate with the telematics server 130 using the administration terminal 140. In addition to retrieving data and analytics, the administration terminal 140 allows the fleet manager 11 to set alerts and geofences for keeping track of the assets 100, receiving notifications of deliveries, and so on.

The operator terminals 150 are electronic devices, such as smartphones or tablets. The operator terminals 150 are used by operators 10 (for example, vehicle drivers) of the assets 100 to both track and configure the usage of the assets 100. For example, as shown in FIG. 1, the operator 10_1 has the operator terminal 150_1, the operator 10_2 has the operator terminal 150_2, and the operator 10_N has the operator terminal 150_N. Assuming the operators 10 all belong to a fleet of vehicles, each of the operators 10 may operate any of the assets 100. For example, FIG. 1 shows that the operator 10_1 is associated with the asset 100_1, the operator 10_2 is associated with the asset 100_2, and the operator 10_N is associated with the asset 100_N. However, any operator 10 may operate any asset 100 within a particular group of assets, such as a fleet. The operator terminals 150 are in communication with the telematics server 130 over the network 50. The operator terminals 150 may run at least one asset configuration application. The asset configuration application may be used by an operator 10 to inform the telematics server 130 that the asset 100 is currently being operated by the operator 10. For example, the operator 10_2 may use an asset configuration application on the operator terminal 150_2 to indicate that the operator 10_2 is currently using the asset 100_2. The telematics server 130 updates the telematics database 132 to indicate that the asset 100_2 is currently associated with the operator 10_2. Additionally, the asset configuration application may be used to report information related to the operation duration of the vehicle, the number of stops made by the operator during their working shift, and so on. Furthermore, the asset configuration application may allow the operator to configure the telematics device 200 coupled to the asset 100 that the operator 10 is operating.

In operation, a telematics device 200 is coupled to an asset 100 to capture asset data. The asset data may be combined with location data obtained by the telematics device 200 from a location module in communication with the satellites 170 and/or sensor data gathered from sensors in the telematics device 200 or another device coupled to the telematics device 200. The combined asset data, location data, and sensor data may be termed "telematics data." The telematics device 200 sends the telematics data to the telematics server 130 over the network 50. The telematics server 130 may process, aggregate, and analyze the telematics data to generate asset information pertaining to the assets 100 or to a fleet of assets. The telematics server 130 may store the telematics data and/or the generated asset information in the telematics database 132. The administration terminal 140 may connect to the telematics server 130, over the network 50, to access the generated asset information. Alternatively, the telematics server 130 may push the generated asset information to the administration terminal 140. Additionally, the operators 10, using their operator terminals 150, may indicate to the telematics server 130 which assets 100 they are associated with. The telematics server 130 updates the telematics database 132 accordingly to associate the operator 10 with the asset 100. Furthermore, the telematics server 130 may provide additional analytics related to the operators 10 including work time, location, and operating parameters. For example, for vehicle assets, the telematics data may include turning, speeding, and braking information. The telematics server 130 can correlate the telematics data to the vehicle's driver by querying the telematics database 132. A fleet manager 11 may use the administration terminal 140 to set alerts for certain activities pertaining to the assets 100. When criteria for an alert is met, the telematics server 130 sends a message to the administration terminal 140 to notify a fleet manager 11, and may optionally send alerts to the operator terminal 150 to notify an operator 10 of the alert. For example, a vehicle driver operating the vehicle outside of a service area or hours of service may receive an alert on their operator terminal 150. A fleet manager 11 may also use the administration terminal 140 to configure a telematics device 200 by issuing commands thereto via the telematics server 130. Alerts may also be sent to the telematics device 200 to generate an alert to the driver such as a beep, a displayed message, or an audio message.

Telematics Device

Figure 2:
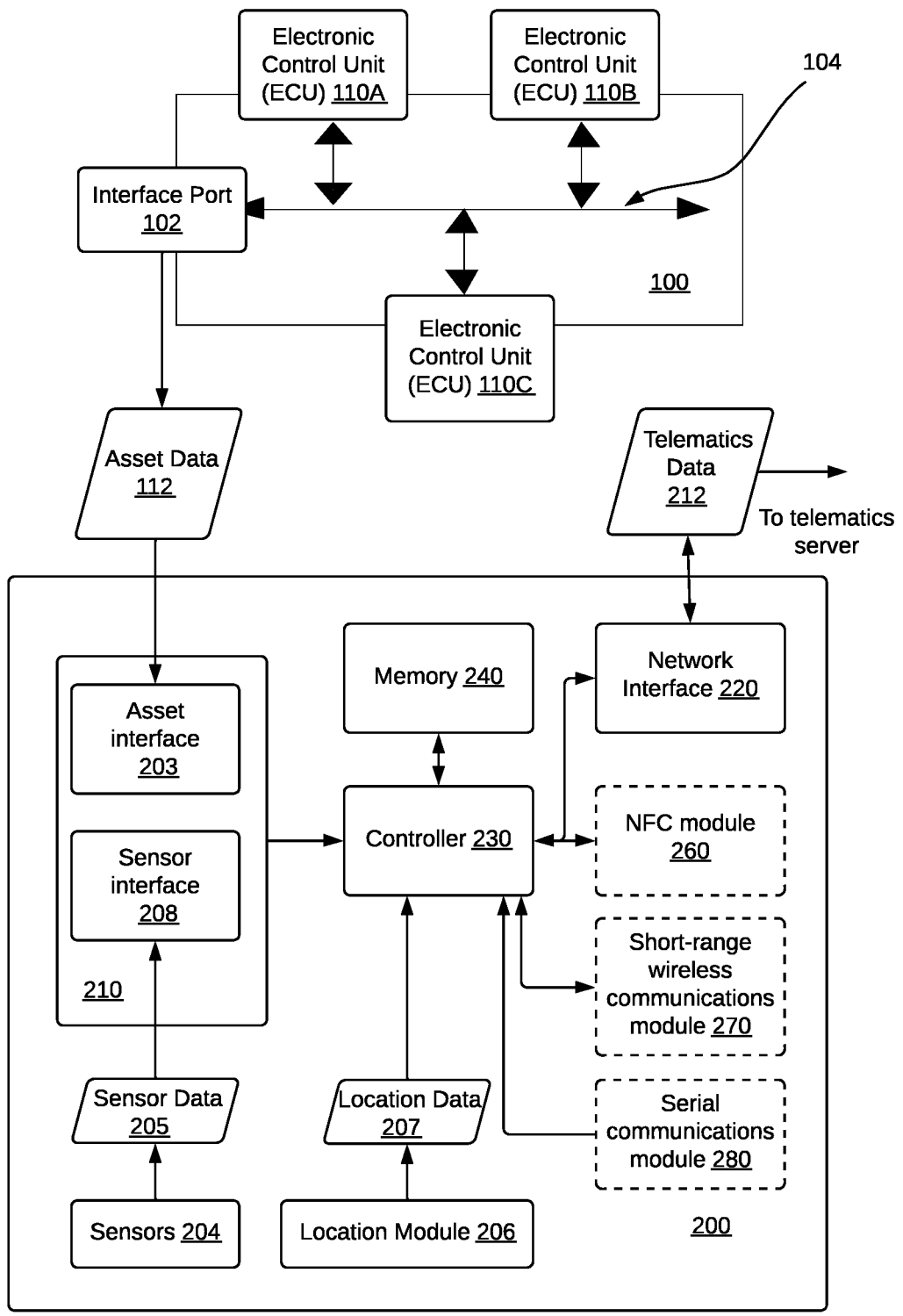
FIG. 2 is a block diagram showing a telematics device coupled to an asset.

Further details relating to the telematics device 200 and how it interfaces with an asset 100 are shown with reference to FIG. 2. FIG. 2 depicts an asset 100 and a telematics device 200 coupled thereto. Selected relevant components of each of the asset 100 and the telematics device 200 are shown.

The asset 100 may have a plurality of electronic control units (ECUs). An ECU is an electronic module which interfaces with one or more sensors for gathering information from the asset 100. For example, an engine coolant temperature (ECT) ECU may contain a temperature sensor and a controller for converting the measured temperature into digital data representative of the oil temperature. Similarly, a battery voltage ECU may contain a voltage sensor for measuring the voltage at the positive battery terminal and a controller for converting the measured voltage into digital data representative of the battery voltage. A vehicle may, for example, have around seventy ECUs. For simplicity, only a few of the ECUs 110 are depicted in FIG. 2. For example, in the depicted embodiment the asset 100 has three ECUs shown as the ECU 110A, the ECU 110B, and the ECU 110C ("the ECUs 110"). The ECU 110A, the ECU 110B, and the ECU 110C are shown to be interconnected via an asset communications bus. One example of an asset communications bus is a Controller Area Network (CAN) bus. For example, in FIG. 2 the ECUs 110 are interconnected using the CAN bus 104. The ECUs 110 send and receive information to one another in CAN data frames by placing the information on the CAN bus 104. When an ECU 110 places information on the CAN bus 104, other ECUs 110 receive the information and may or may not consume or use that information. Different protocols may be used to exchange information between the ECUs over a CAN bus. For example, ECUs 110 in trucks and heavy vehicles use the Society of Automotive Engineering (SAE) J1939 protocol to exchange information over a CAN bus 104. Most passenger vehicles use the SAE J1979 protocol, which is commonly known as On-Board Diagnostic (OBD) protocol to exchange information between ECUs 110 on their CAN bus 104. In industrial automation, ECUs use a CANOpen protocol to exchange information over a CAN bus 104. An asset 100 may allow access to information exchanged over the CAN bus 104 via an interface port 102. For example, if the asset 100 is a passenger car, then the interface port 102 is most likely an OBD-II port. Data accessible through the interface port 102 is termed the asset data 112. In some embodiments, the interface port 102 includes a power interface for providing electric power to a telematics device 200 connected thereto.

The telematics device 200 includes a controller 230 coupled to a memory 240, an interface layer 210 and a network interface 220. The telematics device 200 also includes one or more sensors 204 and a location module 206 coupled to the interface layer 210. The telematics device 200 may also contain some optional components, shown in dashed lines in FIG. 2. For example, the telematics device 200 may contain one or more of: a near-field communications (NFC) module such as NFC module 260, a short-range wireless communications module 270, and a wired communications module such as a serial communications module 280. In some embodiments (not shown), the telematics device 200 may have a dedicated power source or a battery. In other embodiments, the telematics device 200 may receive power directly from the asset 100, via the interface port 102. The telematics device 200 shown is an example. Some of the components shown in solid lines may also be optional and may be implemented in separate modules. For example, some telematics devices (not shown) may not have a location module 206 and may rely on an external location module for obtaining the location data 207. Some telematics devices may not have any sensors 204 and may rely on external sensors for obtaining sensor data 205.

The controller 230 may include one or any combination of a processor, microprocessor, microcontroller (MCU), central processing unit (CPU), processing core, state machine, logic gate array, application-specific integrated circuit (ASIC), field-programmable gate array (FPGA), or similar hardware components, capable of executing the actions performed by the controller 230 as described herein. The controller 230 may have an internal memory for storing machine-executable programming instructions to conduct the methods described herein.

The memory 240 may include read-only-memory (ROM), random access memory (RAM), flash memory, magnetic storage, optical storage, and similar, or any combination thereof, for storing machine-executable programming instructions and data to support the functionality described herein. The memory 240 is coupled to the controller 230 thus enabling the controller 230 to execute the machine-executable programming instructions stored in the memory 240 and to access the data stored therein. The memory 240 may contain machine-executable programming instructions, which when executed by the controller 230, configures the telematics device 200 for receiving asset data 112 from the asset 100 via the asset interface 202, and for receiving sensor data 205 from the sensors 204 and/or location data 207 from the location module 206 via the sensor interface 208. The memory 240 may also contain machine-executable programming instructions for combining asset data 112, sensor data 205 and location data 207 into telematics data 212. Additionally, the memory 240 may further contain instructions which, when executed by the controller 230, configures the telematics device 200 to transmit the telematics data 212 via the network interface 220 to a telematics server 130 over a network 50. In some embodiments, the memory 240 only stores data, and the machine-executable programming instructions for conducting the aforementioned tasks are stored in an internal memory of the controller 230.

The location module 206 may be a global positioning system (GPS) transceiver or another type of location determination peripheral that may use, for example, wireless network information for location determination. The location module 206 is coupled to the controller 230 and provides location data 207 thereto. The location data 207 may be in the form of a latitude and longitude, for example.

The sensors 204 may be one or more of: a temperature sensor, a pressure sensor, an optical sensor, a motion sensor such as an accelerometer, a gyroscope, or any other suitable sensor indicating a condition pertaining to the asset 100 to which the telematics device 200 is coupled. The sensors provide sensor data 205 to the controller 230 via the sensor interface 208.

The interface layer 210 may include a sensor interface 208 and an asset interface 202. The sensor interface 208 is configured for receiving the sensor data 205 from the sensors 204. For example, the sensor interface 208 interfaces with the sensors 204 and receives the sensor data 205 therefrom. The asset interface 202 receives asset data 112 from the asset 100. In the depicted embodiment, the asset interface 202 is coupled to the interface port 102 of the asset 100. The asset data 112, received at the telematics device 200, from the asset 100 may be in the form of data messages, such as CAN data frames. The asset data 112 may describe one or more of any of: a property, a state, and an operating condition of the asset 100. For example, where the asset 100 is a vehicle, the data may describe the speed at which the vehicle is traveling, a state of the vehicle (off, idle, or running), or an engine operating condition (e.g., engine oil temperature, engine revolutions-per-minutes (RPM), or a battery voltage). In addition to receiving the asset data 112, in some embodiments the asset interface 202 may also receive power from the asset 100 via the interface port 102. The interface layer 210 is coupled to the controller 230 and provides both the asset data 112 and the sensor data 205 to the controller 230.

The network interface 220 may include a cellular modem, such as an LTE-M modem, CAT-M modem, other cellular modem, Wi-Fi modem, or any other communication device configured for communication via the network 50 with which to communicate with the telematics server 130. The network interface 220 may be used to transmit telematics data 212 obtained from the asset 100 to the telematics server 130 for a telematics service or other purposes. The network interface 220 may also be used to receive instructions from the telematics server 130 for configuring the telematics device 200 in a certain mode and/or requesting a particular type of the asset data 112 from the asset 100.

The NFC module 260 may be an NFC reader which can read information stored on an NFC tag. The NFC module 260 may be used to confirm the identity of the operator 10 by having the operator 10 tap an NFC tag onto the telematics device 200 such that the NFC tag is read by the NFC module 260. The information read from the NFC tag may be included in the telematics data 212 sent by the telematics device 200 to the telematics server 130.

The short-range wireless communications module 270 is a component intended for providing short-range wireless communication capability to the telematics device 200. The short-range wireless communications module 270 may be a Bluetooth™. wireless fidelity (Wi-Fi), Zigbee™, or any other short-range wireless communications module. The short-range wireless communications module 270 allows other devices to communicate with the telematics device 200 over a short-range wireless network.

The serial communications module 280 is an example of a wired communications module. The serial communications module 280 is an electronic peripheral for providing serial wired communications to the telematics device 200. For example, the serial communications module 280 may include a universal asynchronous receiver transmitter (UART) providing serial communications per the RS-232 protocol. Alternatively, the serial communications module 280 may be a serial peripheral interface (SPI) bus, or an inter-integrated circuit (I2C) bus. As another example, the serial communications module 280 may be a universal serial bus (USB) transceiver.

In operation, an ECU 110, such as the ECU 110A, the ECU 110B, or the ECU 110C communicates asset data over the CAN bus 104. The asset data exchanged between the ECUs 110, over the CAN bus 104 are accessible via the interface port 102 and may be retrieved as the asset data 112 by the telematics device 200. The controller 230 of the telematics device 200 receives the asset data 112 via the asset interface 202. The controller 230 may also receive sensor data 205 from the sensors 204 over the sensor interface 208. Furthermore, the controller 230 may receive location data 207 from the location module 206. The controller 230 combines the asset data 112 with the sensor data 205 and the location data 207 to obtain the telematics data 212. The controller 230 transmits the telematics data 212 to the telematics server 130 over the network 50 via the network interface 220. Optionally, an operator 10 may tap an NFC tag to the NFC module 260 to identify themself as the operator 10 of the asset 100. Additionally, an external peripheral, such as a GPS receiver, may connect with the telematics device 200 via the short-range wireless communications module 270 or the serial communications module 280 for providing location information thereto. In some embodiments, the telematics device 200 may receive, via the network interface 220, commands from the telematics server 130. The received commands instruct the telematics device 200 to be configured in a particular way. For example, the received commands may configure the way in which the telematics device gathers asset data 112 from the asset 100 as will be described in further detail below.

The telematics data 212 which is composed of asset data 112 gathered from the asset 100 combined with the sensor data 205 and the location data 207 may be used to derive useful data and analytics, by the telematics server 130. However, there are times when additional data, which is not provided by the asset 100, the sensors 204 or the location module 206 may be needed. The telematics device 200 may have a limited number of sensors 204 such as accelerometers or gyroscopes providing limited information about the motion of the asset 100 on which the telematics device 200 is deployed. The location module 206 may provide location and direction information. However, in some cases, more information may be needed to derive useful data and analytics pertaining to the asset 100. One example of information that is not typically provided by the telematics device 200 is video capture data. Another example of information that is not typically provided by the telematics device 200 is any proprietary signaling provided by devices which does not follow any of the standard protocols (OBD-II, J1939 or CANOpen). Some equipment may not have a CAN bus and may provide proprietary digital and/or analog signals. Examples of such devices include industrial equipment, winter maintenance equipment such as salt spreaders, farming equipment, and the like. Additionally, the telematics device 200 may not have an NFC module 260 or a short-range wireless communications module 270 thus limiting its connectivity capabilities.

Integrated Telematics Device

Figure 3:
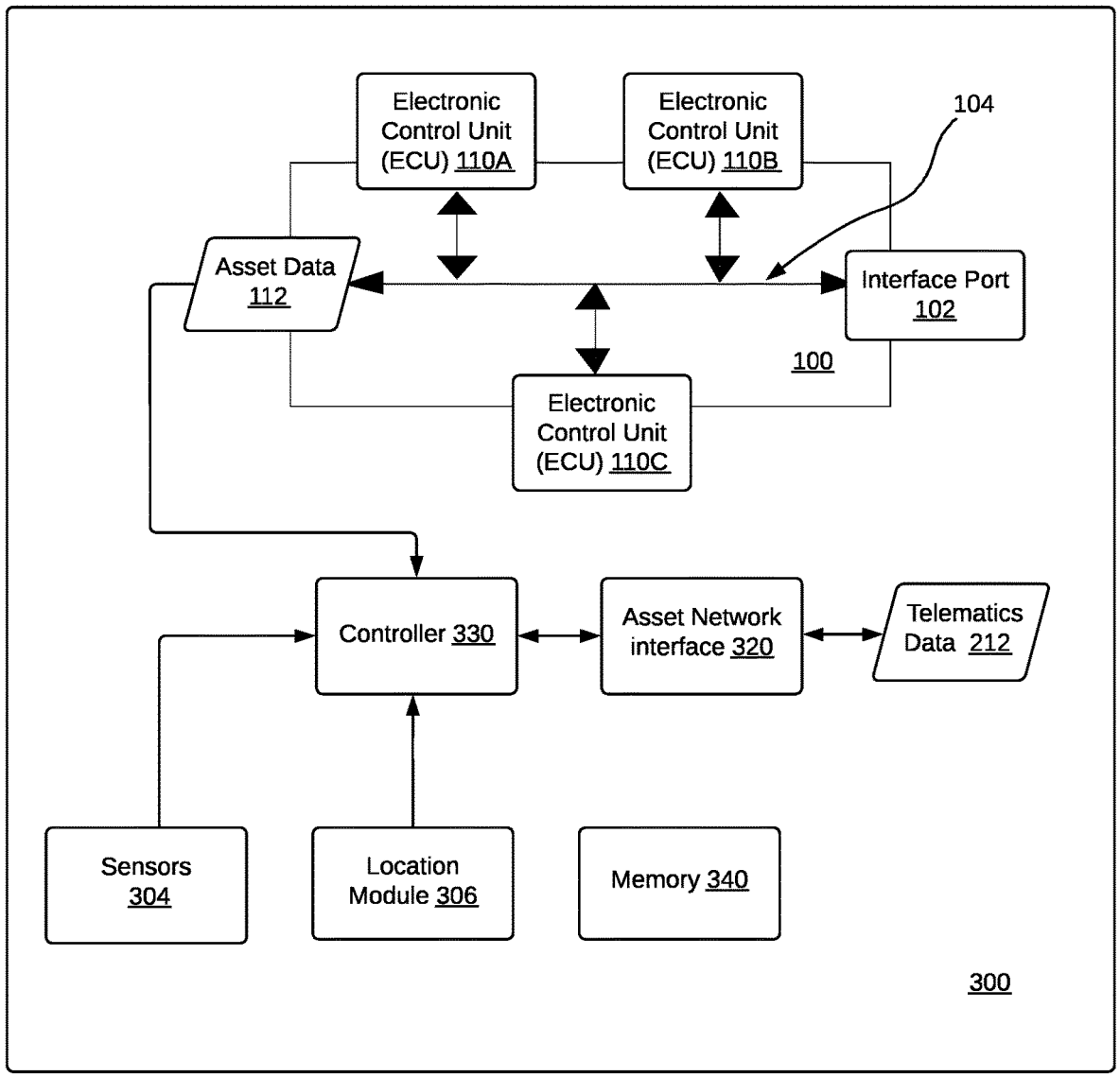
FIG. 3 is a block diagram showing an asset having a telematics device integrated therein and I/O expander coupled thereto.

In the above-mentioned figures, a telematics device is shown as a separate entity connected with a corresponding asset. The telematics device, however, may have its components integrated into the asset 100 at the time of manufacture of the asset 100. This may be the case when the asset 100 is a connected car having an asset network interface. For example, with reference to FIG. 3, there is shown an asset 300 with the components of a telematics device integrated therein, in accordance with embodiments of the present disclosure. The asset 300 is similar to the asset 100 in that it has an asset communications bus, in the form of the CAN bus 104, and a plurality of ECUs 110. The asset 300 also has a controller 330, an asset network interface 320, a memory 340, sensors 304, and a location module 306.

The controller 330 is similar to the controller 230 discussed above. However, the controller 330 is directly connected to the asset communications bus, which is a CAN bus 104. In some embodiments, the controller 330 can be behave as another ECU 110. The controller 330 directly obtains the asset data 112 from the other ECUs 110. In some implementations, the controller 330 executes machine-executable programming instructions for performing other functions relating to the vehicle in addition to capturing the asset data 112. For example, the controller 330 may execute machine-executable programming instructions for the vehicle entertainment system, climate control, roadside assistance, and so on. In other implementations, the controller 330 is limited to executing machine-executable programming instructions for capturing the asset data 112 from the other ECUs 110 and the asset has other controllers for executing other functions.

The memory 340 is similar to the memory 240 discussed above. The memory 340 contains machine-executable programming instructions which, when executed by the controller 330, cause the controller to gather asset data 112 from the ECUs 110 via the CAN bus 104. In some implementations, the memory 340 contains machine-executable programming instructions for the vehicle entertainment system, climate control, roadside assistance, or other functions needed by the asset 300.

The sensors 304 are a plurality of sensors that are similar to the sensors 204 discussed above, but may also contain other sensors. Specifically, the controller 330 may also process sensor data sent by other sensors deployed in the vehicle that are distinct from the sensors 204 of the telematics device 200. For example, the sensors 304 may include door sensors, window sensors, seatbelt sensors, occupancy sensors, airbag sensors, and the like.

The location module 306 is similar to the location module 206 of the telematics device 200.

The asset network interface 320 is similar to the network interface 220 of the telematics device 200. The asset network interface 320 may be used by the asset 300 to communicate with an original equipment manufacturer (OEM) server, to a roadside assistance server, or for other purposes. The controller 330 may utilize the asset network interface 320 for the transmission of telematics data 212. The asset 300 may have an interface port 102 for connecting thereto a device such as a diagnostic tool including, but not limited to, an OBD-II reader device.

Power Consumption of a Telematics Device

A telematics device deployed in an asset whether connected to an interface port or integrated within the asset may be configured to report telematics data pertaining to the asset at all times. The telematics device, however, consumes power as it is gathering asset and sensor data, as well as when it is transmitting telematics data to a remote server via the network interface. Power consumed by the telematics device can drain the battery of an asset if the telematics device is powered all the time. As such, a distinction is made between cases when the asset is on and in motion and when the asset is off, as will be described below.

While the vehicle is operational with the ignition turned on (or the electric motor of an EV is on), a telematics device 200 obtains and sends telematics data 212 to the telematics server 130 as described above. In order to report the location data 207 with a fine granularity (i.e., the location up to a few meters' accuracy), the location data 207 is reported to the telematics server 130 several times per second. For example, a vehicle traveling at 60 km/h moves 16 meters per second. A vehicle moving at 120 km/h moves 32 meters per second. The frequency of reporting the location data 207 may be configurable. In some applications reporting location once per minute or every several minutes is sufficient. With respect to asset data 112, there is significantly more asset data 112 when the asset, such as a vehicle, is in motion with the engine running. Reporting the telematics data 212 in real-time or near real-time thus requires the telematics device to be in a fully operational mode in which it gathers the asset data 112, the sensor data 205 and the location data 207, combines them into telematics data 212 and sends the telematics data 212 over the network interface 220. The sensors 204, the location module 206, the interface module, and the network interface 220 all have to be powered up during the fully operational mode.

When the vehicle is off (i.e., the ignition of an ICE vehicle is off or the EV is off), there is little to no asset data 112 generated by the ECUs 110. Additionally, when the vehicle is stationary, location data 207 does not change. This is the case, for example, when a vehicle is parked. As such, having the telematics device 200 in a fully operational mode with all the components such as the controller, the sensors, and the network interface powered up all the time is unnecessary. In fact, having all such components powered up will deplete the asset battery powering such components. For example, in a vehicle with an ICE, when the engine is off, the alternator is not running and all the telematics device components are drawing power from the vehicle's battery. As another example, in an EV, when the vehicle is off and parked, the powertrain battery is not charging the auxiliary battery and as such the telematics device components are drawing power from the auxiliary battery and may drain it over time. More on the architecture of the electric systems of both ICE vehicles and EVs below.

One approach to reducing power consumed by the telematics device when it is coupled to a vehicle asset which is not turned on is to implement a low-power scheme for the telematics device. In a low-power scheme (or a power-saving scheme), the telematics device enters a low-power mode (also known as sleep mode) and periodically wakes up. In other words, the telematics device alternates between a sleep duration and a wake-up duration. During a sleep duration, the controller of the telematics device is running at a slower clock speed (i.e., is in a slow-clocking mode), and most of the peripherals such as the sensors, location module, and network interface are powered off. During a wake-up duration, the controller 230 exits the slow-clocking mode and the peripherals are powered on. The telematics device may report the location thereof as the location data 207, which is part of the telematics data 212 sent to the telematics server 130 during the wake-up duration. Since the vehicle is off, little to no asset data 112 is included in the telematics data 212 sent to the telematics server 130. In this low-power scheme, the longer the sleep duration between two wake-up durations, the less the telematics server 130 receives updates about the location of the telematics device (and hence the location of the asset in which the telematics device is deployed). However, a short sleep duration, which translates to more frequent wake-up durations consumes more electric power. Examples of a short sleep duration range from a few minutes to an hour. Examples of a long sleep duration range from a few hours to a few days. One combined approach is to use a short sleep duration until a long sleep duration threshold is met or exceeded, and then using a long sleep duration. This approach assumes that a vehicle that is not turned on for some time may be parked for an extended period of time and accordingly, receiving a frequent update about the vehicle's location is of less importance. The combined approach to a low-power scheme is explained further with reference to FIG. 4.

Figure 4:
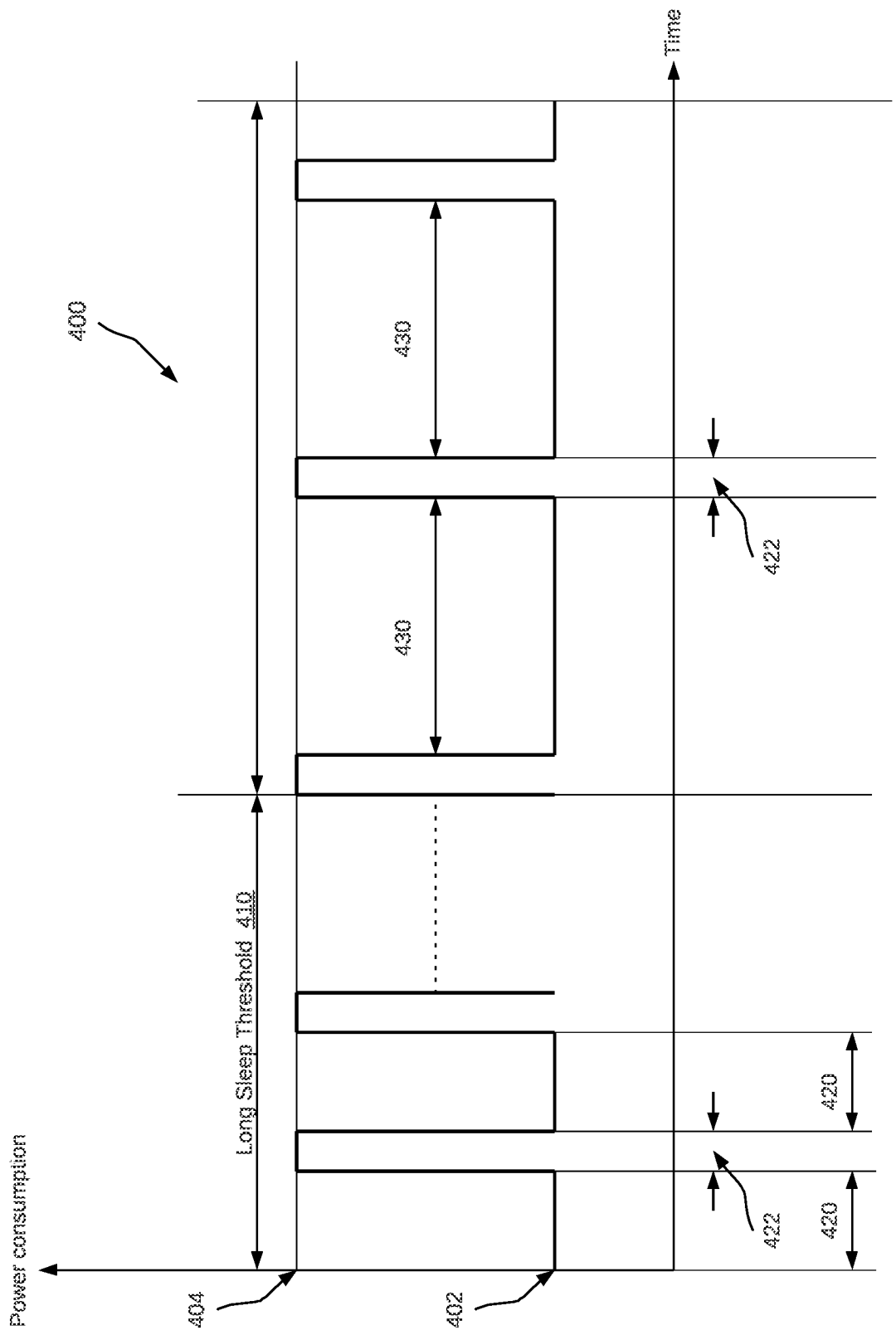
FIG. 4 is a graph showing the power consumption of the telematics device versus time during a power-saving scheme.

FIG. 4 depicts a power-saving scheme 400 for operating a telematics device 200 when the asset 100, which may be a vehicle, to which the telematics device 200 is coupled is turned off. The power-saving scheme 400 may also be employed by a controller 330 in an integrated asset 300, as discussed above. The discussion below of FIG. 4 will refer to the telematics device 200 of FIG. 2, but will also apply to an integrated telematics device such as described in FIG. 3. A vehicle is off when an ignition is off for a vehicle with an internal combustion engine. For an electric vehicle (EV), a particular signal indicates whether the vehicle is on or off. For example, as discussed below, the battery voltage in combination with other data may determine whether a vehicle is on or off.

In FIG. 4, the horizontal axis represents time, while the vertical axis represents the electric power consumption of the telematics device 200. At time 0, the telematics device 200 detects that the vehicle to which the telematics device 200 is coupled is off and therefore the telematics device 200 is now drawing power from the battery of the asset. The battery may be drained if the telematics device 200 remains in fully operational mode. Accordingly, at time 0, the telematics device 200 operates in sleep mode. The power consumption of the telematics device during the sleep mode is represented by the sleep power consumption level 402. After a short sleep duration 420, the telematics device 200 exits sleep mode and is fully operational for a wake-up duration 422. During the wake-up duration 422, the telematics device 200 sends the telematics data 212 to the telematics server 130 via the network interface 220. During the wake-up duration, the telematics device 200 is consuming power at the full power level 404. The cycle comprising the short sleep duration 420 and the wake-up duration 422 is repeated until a time threshold since the start of the first sleep duration (i.e., time 0 in the figure) is exceeded. The time threshold may be termed the long sleep threshold 410. If the long sleep threshold 410 is exceeded, the telematics device 200 switches to a long sleep duration 430. As seen in FIG. 4, past the long sleep threshold 410, the telematics device sleeps for a long sleep duration 430 and wakes up for a wake-up duration 422. An example of the short sleep duration may include 30 minutes, while an example of a long sleep duration may be 23 hours.

In the event that the asset is turned on, the telematics device 200 upon detecting an ignition signal or an EV on signal, will stop executing the power-saving scheme 400 and will be in the fully operational mode.

Vehicles with Internal Combustion Engines

Motor vehicles powered by an ICE are equipped with batteries for providing electric energy to power the electrical components thereof. Typical vehicle batteries are either 12V batteries or 24V batteries. In this disclosure, mainly 12V batteries will be discussed, but it would be apparent to those of skill in the art that the methods described would be equally applicable to 24V batteries, and to batteries operating at other voltages. A vehicle battery needs to be charged such that it provides a battery output voltage which is in a battery operating voltage range. The battery operating voltage range has a lower battery output voltage limit and an upper battery output voltage limit. When the vehicle battery output voltage drops below the lower battery output voltage limit, the battery is considered undercharged and needs to be charged or it will not provide sufficient electrical power to the various electrical components. In the example of a 12V battery, the lower battery output voltage limit has been found to be 12.2V. When the vehicle battery output voltage rises above the upper battery output voltage limit, the vehicle battery is considered overcharged. An overcharged battery may deteriorate quickly and the vehicle battery output voltage, which is higher than the upper battery output voltage limit, may cause damage to some of the electrical components of the vehicle. In the example of a 12V battery, the upper battery output voltage limit has been found to be 12.6V. It is therefore generally desirable to keep the battery output voltage of a 12V vehicle battery between 12.2V and 12.6V.

Cranking

Internal combustion engines need to be cranked to start their operation. Cranking an engine involves rotating the engine's crankshaft causing the pistons to move in a reciprocating manner within their corresponding cylinders. Rotating the crankshaft also causes intake valves to open letting air into the cylinders and causes an injection pump to inject fuel into the cylinders. For engines using carburetors, the intake valves let a fuel mixture of gasoline and air into the cylinders. For gasoline engines, cranking also causes the spark plugs to be activated thus igniting the fuel mixture and producing heat energy which displaces the pistons inside the cylinders. The displacement of the pistons in a reciprocating manner within the cylinders is converted to rotary motion by the crankshaft, and the engine is said to have been started. Cranking an engine is typically done by a starter motor mechanically coupled to the engine. The starter motor relies mainly on the vehicle battery to run during cranking.

Alternator

Electricity generators used in vehicles are often referred to as alternators since they generate electricity having an alternating current (AC). The generated AC is then rectified and converted to direct current (DC) to power the vehicle's electrical components and to charge the vehicle's battery. An alternator is mechanically coupled to a vehicle's internal combustion engine and converts mechanical energy provided by the engine to electrical energy. In order to charge a vehicle battery to a particular output voltage, an alternator is configured to generally produce an alternator output voltage which is higher than the battery voltage by a charging voltage offset. Accordingly, an alternator has a lower alternator output voltage limit, which is greater than a corresponding lower battery output voltage limit by the charging voltage offset. Similarly, an alternator has an upper alternator output voltage limit which is greater than a corresponding upper battery output voltage limit by the charging voltage offset. By way of example, a charging voltage offset may be 1V. For a 12V battery, the lower battery output voltage limit is 12.2V and accordingly the lower alternator output voltage limit is 13.2V for an alternator configured to charge the battery by a charging voltage offset of 1V. Similarly, for the 12V battery, the upper battery output voltage limit is 12.6V and accordingly the upper alternator output voltage limit is 13.6V for an alternator configured to charge the battery by a charging offset of 1V.

Vehicle Electric System

Figure 5:
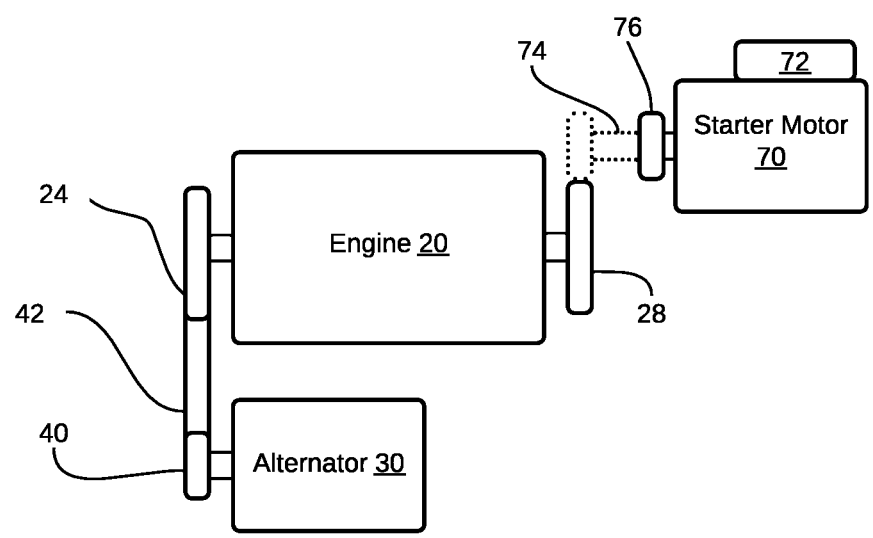
FIG. 5 is a simplified diagram depicting an internal combustion engine mechanically coupled to both an alternator and a starter motor.

An alternator is mechanically and rotationally coupled to a vehicle's engine in order to produce electricity. Similarly, a starter motor is mechanically and rotationally coupled to a vehicle's engine in order to crank the engine. With reference to FIG. 5, there is shown an engine 20 mechanically coupled to both an alternator 30 and a starter motor 70.

The engine 20 comprises a plurality of cylinders (now shown) in which a corresponding plurality of pistons are disposed and configured for reciprocating motion. The engine 20 also houses a crankshaft (not shown) mechanically coupled to the pistons. As known in the art, the reciprocating motion of the pistons are converted to rotational motion by the crankshaft. At one end of the crankshaft, there is a drive pulley 24 connected with the crankshaft and rotatable therewith. At the opposite end of the crankshaft, there is a flywheel 28 connected with the crankshaft and rotatable therewith. The flywheel 28 may be in the form of a gear and have a plurality of teeth.

An alternator 30 is disposed alongside the engine 20 and rotationally coupled thereto. The alternator 30 may be affixed to the engine block or to any part of the vehicle chassis. The alternator 30 includes an alternator pulley 40 connected to and rotatable with an alternator shaft. The alternator pulley 40 is rotationally coupled to the drive pulley 24, typically by an alternator belt 42. Accordingly, the alternator shaft rotates with the rotation of the engine crankshaft.

A starter motor 70 is disposed alongside the engine 20. The starter motor 50 has a starter motor shaft 74 which provides rotational motion when electric power is provided to the starter motor 70. A starter motor pinion gear 76 is connected to the starter motor shaft 74 and is rotatable therewith. A starter motor solenoid 72 allows extending and retracting the starter motor shaft 74. To start the engine 20, the starter motor solenoid 72 extends the starter motor shaft 74 until the starter motor pinion gear 76 engages with the flywheel 28 and rotates the engine's crankshaft. Once the engine has started, the starter motor solenoid 72 retracts the starter motor shaft 74 so that the starter motor pinion gear 76 disengages from the flywheel 28.

When the engine 20 is off and is not being cranked (started), the crankshaft is not rotating and accordingly the drive pulley 24 is not rotating. As a result, the alternator pulley 40 is also not rotating and no electric power is generated by the alternator 30. Similarly, no power is applied to the starter motor 70 and hence the starter motor pinion gear 76 does not rotate. Additionally, the starter motor shaft 74 is in retracted mode towards the starter motor 70 and the starter motor pinion gear 76 is not engaged with the flywheel 28.

When the engine 20 is cranked (started), for example by a user turning a key in an ignition or actuating a push button ignition switch, electric power is applied from the vehicle's battery to the starter motor 70 including the starter motor solenoid 72. In response to receiving electric power, the solenoid extends the starter motor shaft 74 until the teeth of the starter motor pinion gear 76 engage with the teeth of the flywheel 28, as shown in dotted lines in the figure. Additionally, the starter motor 70 rotates the starter motor shaft 74 thus rotating the starter motor pinion gear 76 therewith. Since the flywheel 28 is engaged with the starter motor pinion gear 76, the flywheel 28 rotates in the opposite direction to that of the starter motor pinion gear 76. The crankshaft rotates with the flywheel 28. As discussed above, the rotation of the crankshaft causes the engine to start. The drive pulley 24 rotates with the crankshaft. Since the alternator pulley 40 is rotationally coupled to the drive pulley 24 by the alternator belt 42, the alternator pulley 40 also rotates and the alternator 30 generates some electricity.

When engine 20 is running, the starter motor 70 is turned off. Additionally, the starter motor solenoid 72 retracts the starter motor shaft 74 such that the starter motor pinion gear 76 is disengaged from the flywheel 28. As the engine is running, the drive pulley 24 is rotating by the action of the mechanical rotational motion produced by the engine 20. The alternator 30 rotates with the engine 20 and produces electricity to power the electrical components of the vehicle.

Figure 6:
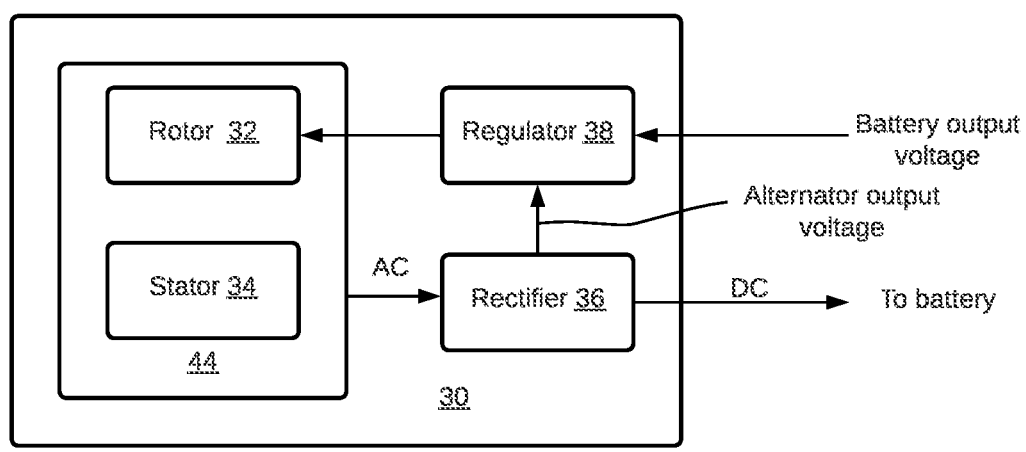
FIG. 6 is a block diagram showing the logical components of an alternator.

The structure and operation of an alternator 30 are known in the art. For illustration, FIG. 6 shows a high-level block diagram of an alternator 30 identifying its principal components. An alternator 30 includes a rotor 32, a stator 34, an alternator housing 44, a rectifier 36, and a regulator 38.

The rotor 32 is disposed on a shaft and rotatable therewith. The rotor 32 features an electromagnet (not shown) which is powered by the vehicle's battery and/or electric power generated by the alternator 30 itself. The power of the electromagnet affects the alternator output voltage. The higher the power of the electromagnet, the higher the alternator output voltage for the same rotational speed of the rotor shaft. Conversely, the lower the power of the electromagnet, the lower the alternator output voltage for the same rotational speed of the rotor shaft.

The stator 34 is circumferentially disposed inside the alternator housing 44 encompassing the rotor 32. The stator 34 is comprised of a plurality of coils typically connected in a star configuration, as known in the art. The coils have terminals at which the generated AC is provided.

The rectifier 36 converts the generated AC provided at the terminals of the coils into DC. In some example embodiments, the rectifier is comprised of a plurality of diodes, and at least one capacitor as known in the art. For a typical 3-phase alternator, there are at least 3 diodes.

The regulator 38 detects the alternator output voltage and ensures that it remains above the lower alternator output voltage limit and below the upper alternator output voltage limit. As shown the regulator 38 checks the battery output voltage and the alternator output voltage. As discussed above, the alternator output voltage is generally higher than the battery output voltage by a charging voltage offset. The regulator 38 determines the desired alternator output voltage based on the battery output voltage. If the alternator output voltage is different from the desired alternator output voltage, the regulator controls the power provided to the electromagnet of the rotor in order to maintain the alternator output voltage between the lower alternator output voltage limit and the upper alternator output voltage limit.

Rotating the alternator pulley 40 causes the rotor 32 to rotate with respect to the stator 34 and induce electricity in the stator 34. The generated electricity is in the form of an alternating current (AC) which is provided at the stator terminals (not shown). The rectifier 36 converts the generated AC to direct current (DC) output. The DC output may be provided to charge the vehicle battery, power the electromagnet of the rotor 32, and power the electrical components of the vehicle while the engine 20 is running.

The regulator 38 determines the desired alternator output voltage based on the battery operating voltage range. The regulator 38 then compares the alternator output voltage, provided thereto by the rectifier, as shown, with the desired alternator output voltage. Based on the comparison, the regulator may increase or decrease the electric power provided to the electromagnet of the rotor 32. For example, for a 12V battery, the alternator output voltage needs to be between 13.2V and 13.6V. If the alternator output voltage was at 14V, then the alternator is overcharging the battery. The regulator 38 reduces the power provided to the electromagnet of the rotor 32. As a result, the alternator output voltage is reduced. This is repeated until the alternator output voltage is at most at the upper alternator output voltage limit of 13.6V. Conversely, if the alternator output voltage is below 13.2V, the regulator 38 increases the electric power provided to the rotor 32. As a result, the alternator output voltage is increased (for the same alternator shaft rotational speed), thus increasing the alternator output voltage. This is repeated until the alternator output voltage is at least at the lower alternator output voltage limit.

Figure 7:
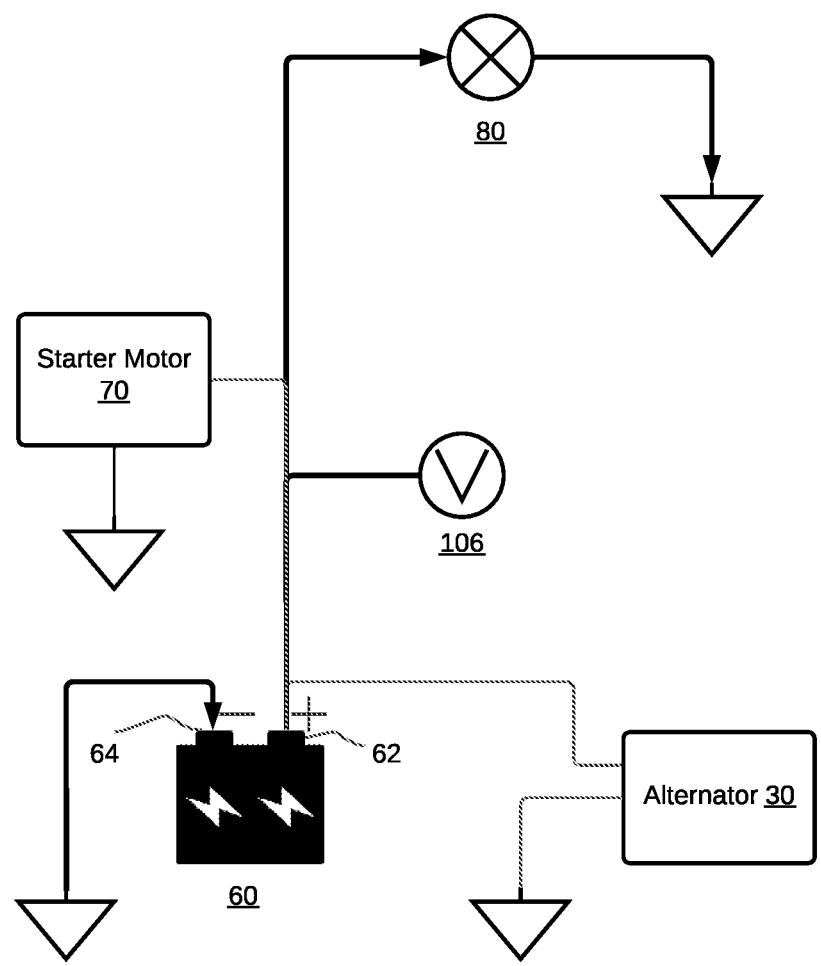
FIG. 7 is a schematic diagram showing selected components of an automotive electric system and current flow therebetween when the vehicle engine is off.
Figure 8:
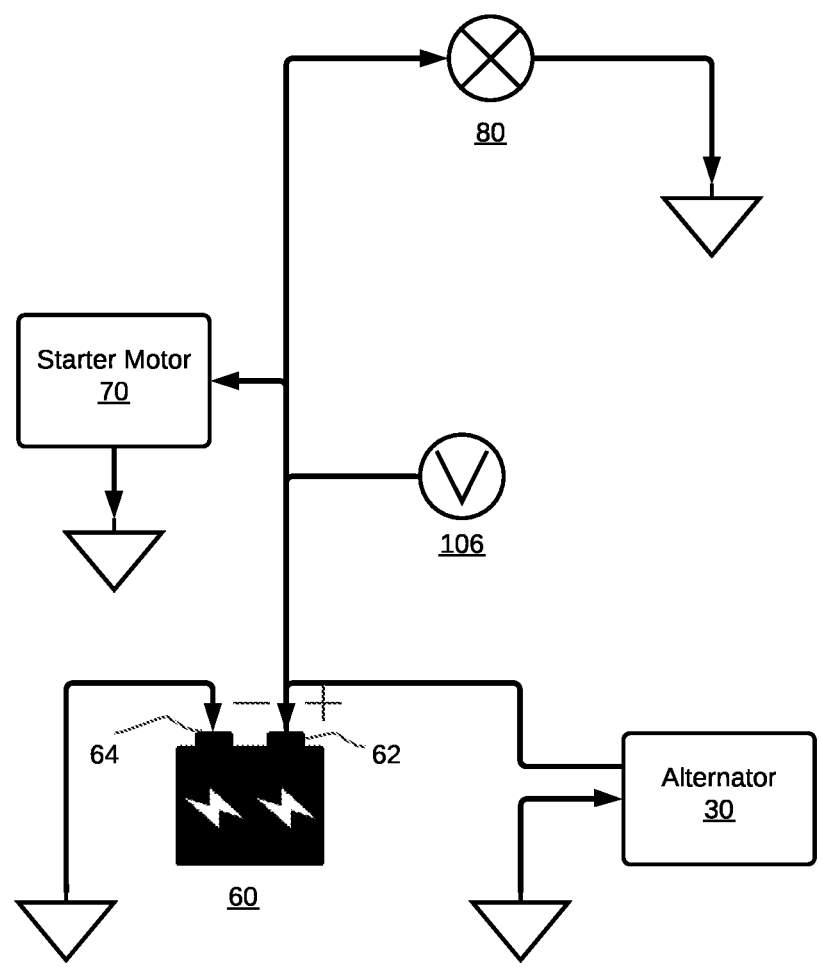
FIG. 8 is a schematic diagram of the components of FIG. 7 and current flow during a cranking event.
Figure 9:
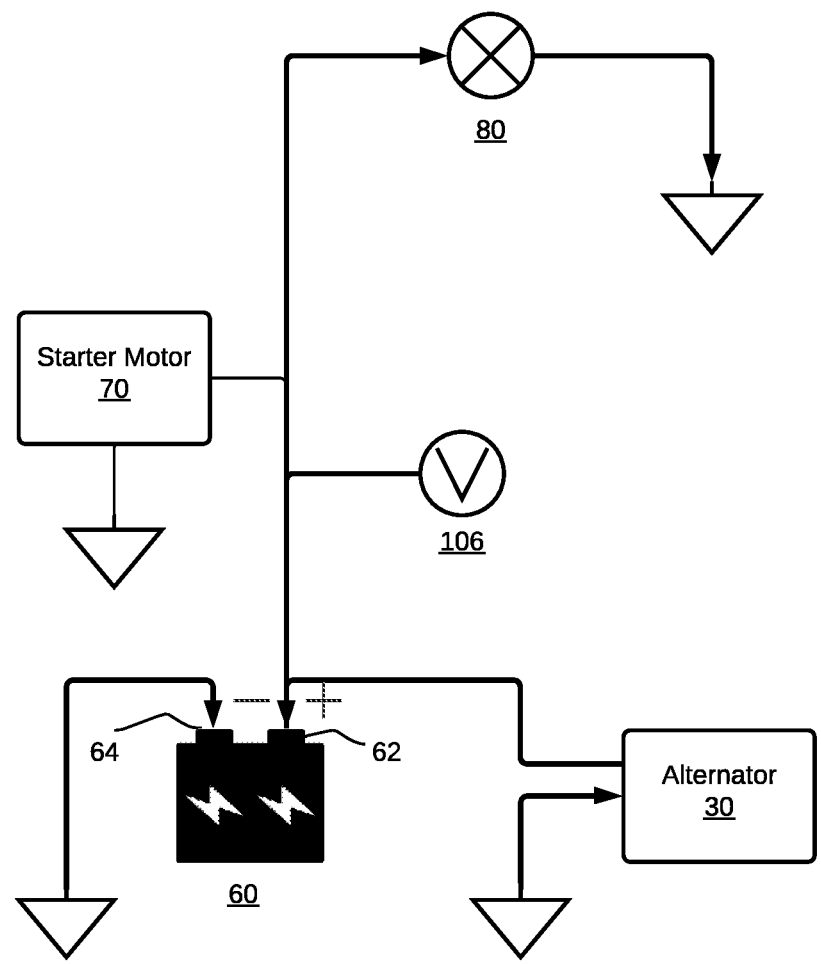
FIG. 9 is a schematic diagram of the automotive electric system of FIG. 8 during normal engine operation.

The electrical connections between the engine 20, the starter motor 70 and the alternator 30 are shown in FIGS. 7-9.

FIGS. 7-9 depict a simplified schematic of a vehicle's electric subsystems including a battery 60, a starter motor 70, an alternator 30, a voltage-sensing device 106, and an electrical component 80 shown as a light bulb. The battery 60 may be a lead acid battery or any other suitable type of battery used in vehicles. The battery 60 has a positive battery terminal 62 connected to the electrical component 80, to the starter motor 70 and to the alternator 30. The battery 60 also has a negative terminal 64 connected to the ground (i.e., the vehicle's metal chassis). The starter motor 70 is connected to the positive battery terminal 62 and to the ground. The alternator is connected to the positive battery terminal 62 and to the ground. The electrical component 80 may be any one of vehicle lights, gauges, air conditioner or entertainment system. The voltage-sensing device 106 is connected to the positive battery terminal 62 and the alternator output. The voltage measuring device may be a voltmeter, galvanometer, analog-to-digital converter (ADC), or any other suitable device that can measure voltage. As discussed below, the telematics device utilizes an ADC to measure the battery voltage.

Turning first to FIG. 7. In this figure, the engine 20 is in off mode. In other words, the engine 20 is neither running nor being cranked. Accordingly, the alternator 30 is not rotating and is not producing any electric power. The only source of electricity in the vehicle is the battery 60. Thickened black lines in FIG. 7 show current flow between the battery 60 and the electrical component 80. Since the battery 60 provides electric power to the electrical component 80 and is not being charged. The voltage measured by the voltage-sensing device 106 is the voltage of the battery 60 only. In the off mode, and in the presence of an electrical component 80 which is turned on, the battery 60 is drained after some time. The time to drain the battery 60 depends on the load of the electrical component 80 and the capacity of the battery 60.

When a vehicle is started by a driver, for example by activating an ignition key, the engine 20, starter motor 70 and alternator 30 are said to be in a cranking state or undergoing a cranking event. With reference to FIG. 8, the diagram shows the same vehicle's electric subsystems of FIG. 7. FIG. 8 also shows the current flowing as solid black lines. During a cranking event, the battery 60 provides power to the starter motor 70 as indicated by the solid line between the positive battery terminal 62 and the starter motor 70. As the starter motor 70 is activated and engages the flywheel 28 as discussed above, the crankshaft of the engine rotates. As the alternator 30 is mechanically coupled to the crankshaft, the alternator shaft also rotates, and the alternator 30 starts generating some electricity. During cranking any electrical component 80 which is turned on consumes electric power from both the battery 60 and/or the alternator 30 depending on electric load of the electrical component 80. The voltage measured at the positive battery terminal 62, by the voltage-sensing device 106, during cranking is termed the "cranking voltage". The cranking voltage fluctuates as the starter motor 70 starts and as the alternator 30 starts generating electricity. As discussed below, there is a point at which the cranking voltage is at a minimum value termed the "minimum cranking voltage" and another point at which the cranking voltage is at a maximum value termed the "maximum cranking voltage".

When the engine 20 starts, the cranking event is terminated and the starter motor 70 is both disengaged from the engine 20 and is no longer powered up. This is illustrated in FIG. 9. After cranking is terminated, the voltage measured at the positive battery terminal 62, by the voltage-sensing device 106, is termed the "device voltage". As shown in FIG. 9, there are solid black lines between the alternator 30 and the positive battery terminal 62 as well as between the positive battery terminal 62 and the electrical component 80 indicating that the electrical components 80 may be consuming electric power from both the alternator 30 and the battery 60.

Battery Voltage During Cranking and Beyond

Figure 10:
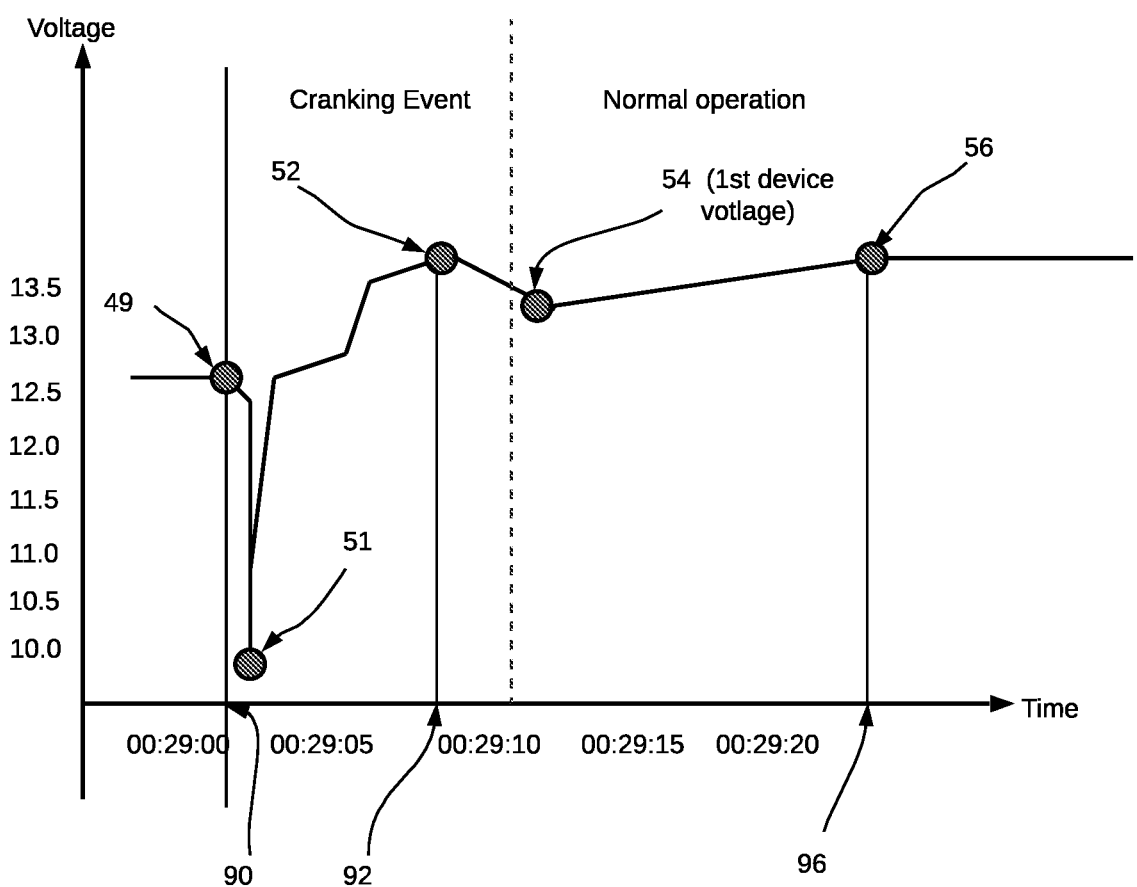
FIG. 10 is a graph depicting cranking and device voltages in an automotive electric system during and subsequent to a cranking event.

With reference to FIG. 10, there is shown a graph depicting voltage measured at the positive battery terminal (to which the output of the alternator is connected) during and after a cranking event. The horizontal axis represents time, while the vertical axis represents the voltage measured at the positive battery terminal 62. Before the cranking event, the measured voltage was around 12.6V. This represents the voltage at the positive battery terminal 62 with the alternator 30 not generating any electrical power. At time 90, the cranking event starts. The first cranking voltage 49 is unchanged and is around 12.6V. As the starter motor 70 draws a large amount of current from the vehicle battery in order to start, the battery output voltage drops significantly. As discussed, the output voltage of the battery during a cranking event is considered a cranking voltage. As can be seen, the cranking voltage drops until it is at a minimum cranking voltage 51 (which is around 9.8V approximately). As the starter motor 70 starts rotating and gains momentum, the current drawn by the starter motor 70 drops and accordingly the cranking voltage rises. Additionally, as the starter motor 70 rotates at a faster speed, so does the crankshaft of the engine, and so does the alternator shaft. As a result, the alternator 30 starts producing electricity, and the cranking voltage rises. As shown between the time 90 and the time 92.

At the time 92, the cranking voltage reaches a maximum cranking voltage 52. Once the engine has fully started, cranking is stopped, and the starter motor 70 is disengaged from the engine both electrically and mechanically. At this point, the voltage measured at the positive battery terminal 62 is the device voltage. The first device voltage 54 has the value of approximately 13.2V. At this point, the regulator 38 may increase the power provided to the electromagnet of the rotor 32 to bring the alternator output voltage to 13.6V so that it is higher by 1V than the battery output voltage, which was measured to be 12.6V before the cranking event. The device voltage reaches a maximum device voltage 56 at a time 96.

Capturing Cranking and Device Voltage Values

Capturing the cranking voltage in real-time and recording voltage value during cranking can later give insights into the characteristics of the battery and/or the charging system.

Device voltage can also give an insight into whether the vehicle's engine is running, or at least whether the ECUs can be queried by the telematics device in order to determine the asset type. In an ICE vehicle, the ECUs may be in a dormant or not-ready state when the ignition is off. Additionally, querying the ECUs when the ignition is off also drains the battery. Querying the ECUs, however, is necessary for determining whether the vehicle is an ICE-powered vehicle or an EV, as well as for determining the make and model of the vehicle. As such, determining that the device voltage indicates that the battery is being charged allows the telematics device to initiate a process of determining the vehicle type by querying the ECUs.

Electric Vehicles

Electric vehicles may be classified broadly into Battery Electric Vehicles (BEVs), and Hybrid Electric Vehicles (HEVs). Of the HEVs, some are plug-in hybrid vehicles (PHEVs). BEVs rely on a powertrain battery to drive the vehicle. The powertrain battery is typically charged from an AC charger. HEVs have an ICE and an electric motor. PHEVs also have an ICE and an electric motor, but may also be charged from an AC charger.

Figure 11:
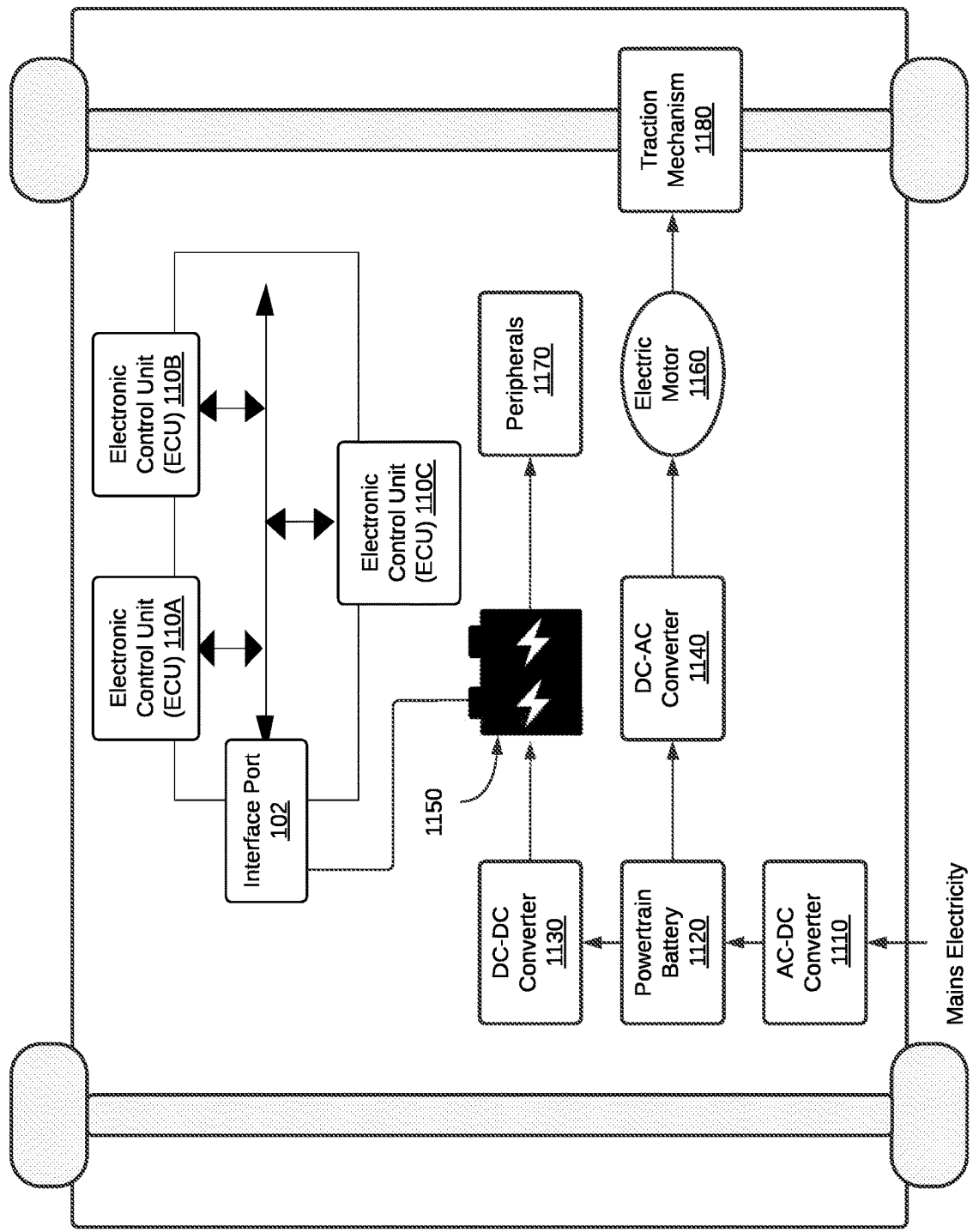
FIG. 11 is a simplified block diagram of a battery electric vehicle (BEV)

FIG. 11 depicts a simplified block diagram of a BEV 1100. The BEV 1100 comprises an AC-DC converter 1110, a powertrain battery 1120, a DC-AC converter 1140, an electric motor 1160, and a traction mechanism 1180. The BEV 1100 also comprises a DC-DC converter 1130, a peripheral battery 1150, and a plurality of peripherals 1170.

The AC-DC converter 1110 converts alternating current (AC) provided by mains electricity to charge the powertrain battery 1120. The powertrain battery 1120 is a high-capacity, high-voltage battery for driving the electric motor 1160 of the BEV 1100. For example, the powertrain battery may have a voltage of 300V across the terminals thereof. If the Electric Motor 1160 is a DC motor, the powertrain battery 1120 may drive the electric motor 1160 directly. More commonly, BEVs use AC motors to drive the traction mechanism 1180. In this case, the output of the powertrain battery 1120 passes through a DC-AC converter 1140 to generate AC that drives the electric motor 1160. The electric motor drives the traction mechanism 1180 that causes the BEV to move.

The BEV 1100 also has a plurality of peripherals 1170 that typically run on a lower voltage. Examples of peripherals 1170 include the lights, entertainment system, gauges, security systems, and the like. To run the peripherals 1170 a peripheral battery 1150 is available in the BEV 1100 for powering the peripherals 1170. The peripheral battery 1150 is charged from the powertrain battery 1120 via a DC-DC converter 1130.

The BEV 1100 also has an asset communications bus, such as the CAN bus 104 to which a plurality of ECUs 110 are connected, and is accessible via an interface port 102 as discussed above with reference to FIG. 2. The interface port 102 may also provide access to the battery voltage. As such a telematics device 200 may connect to the BEV 1100, read the status of the ECUs and the battery voltage of the peripheral battery 1150.

When the BEV 1100 is off and parked (i.e., stationary), the peripheral battery 1150 is not being charged. As such, the battery voltage of the peripheral battery 1150 is the open circuit voltage of the battery. For example, the battery voltage of the peripheral battery 1150 may be 12.6V. When the BEV 1100 is turned on, some peripherals 1170 are turned on and consume electric power from the peripheral battery 1150. In this case, the DC-DC converter 1130 is enabled for charging the peripheral battery 1150 and the battery voltage of the peripheral battery 1150 is at a charging voltage.

Battery Voltage Monitoring

In view of the foregoing, the telematics device 200 needs to have a device for reading voltage at the positive battery terminal 62 ("battery voltage") during the cranking stage and subsequent to that. Similarly, for a BEV, the telematics device needs to read the battery voltage of the peripheral battery 1150. In this disclosure, a device for reading battery voltage at the positive battery terminal of a battery is termed a voltage monitor. An example of a voltage monitor 1245 is shown in FIG. 12A.

Figure 12A:
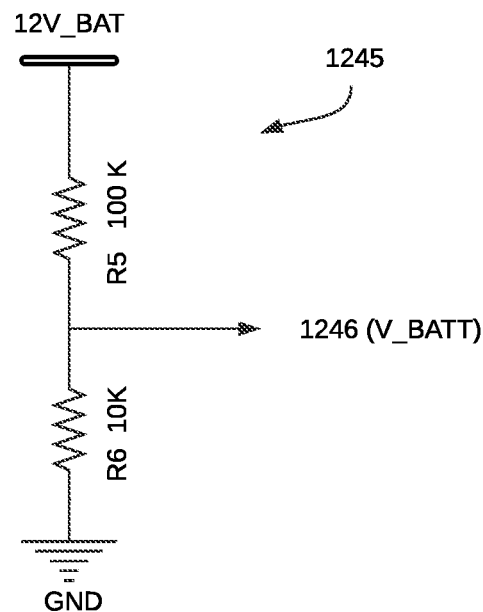
FIG. 12A is a schematic for a voltage divider circuit used for monitoring battery voltage via a power supply line.

One possible implementation of the voltage monitor 1245 is shown in FIG. 12A. The voltage monitor 1245 of FIG. 12A is a potential divider (a.k.a. "resistor divider" or "voltage divider") consisting of a first resistor R5 and a second resistor R6. The first resistor (R5) is disposed between the power supply line (12V_BATT) and the voltage monitor output 1246. The second resistor is disposed between the voltage monitor output 1246 and the ground (GND). In the depicted embodiment, the first resistor R5 is 100K and the second resistor R6 is 10K. The voltage measured at 1246 is termed V_BATT and is determined by the formula:

$$V\_BATT = 12V\_BATT * (R5/(R5+R6))$$

Or $$V\_BATT = 12V\_BATT * (10/110)$$

$$V\_BATT = 12V\_BATT/11$$

Accordingly, once the value of the voltage of the voltage monitor output 1246 is known, it may be scaled up (in this case by multiplying by 11) to obtain the value of the battery voltage as measured at 12V_BATT.

A telematics device measures the battery voltage by passing the output of a voltage monitor, such as the voltage monitor 1245 to an analog-to-digital converter (ADC). The output of the ADC is a digital signal representative of the battery voltage. As discussed, the value of the voltage monitor output 1246 may need to be scaled up in firmware by the telematics device to arrive at the true value of the battery voltage V_BATT.

Voltage Thresholds

A telematics device may be installed in an ICE-powered vehicle or an EV. When a telematics device is first installed, the telematics device is unaware of the vehicle type and whether it is an ICE vehicle or an EV. In some implementations, the telematics device determines the vehicle type of the vehicle in which it is installed by querying the ECUs. In other implementations, the vehicle type may be pushed to the telematics device from a remote server such as the telematics server. As shown in FIG. 4, the telematics device runs power management schemes in which the telematics device is in sleep mode. When the telematics device is in sleep mode, the telematics device cannot process battery voltage readings. For example, during the sleep durations 420 and 430 of the power-saving scheme 400 of FIG. 4, changes to the battery voltage cannot be captured. Cranking of an ICE typically takes place after the asset has been off for some time and is hence running a power management scheme, such as the power-saving scheme 400. This disclosure proposes innovative solutions for waking up the telematics device or at least some components thereof to capture cranking voltage and other voltages discussed above. The solutions are based on detecting when the battery voltage crosses certain thresholds, which in turn are also based on the vehicle type. These thresholds are shown in FIG. 12B.

Figure 12B:
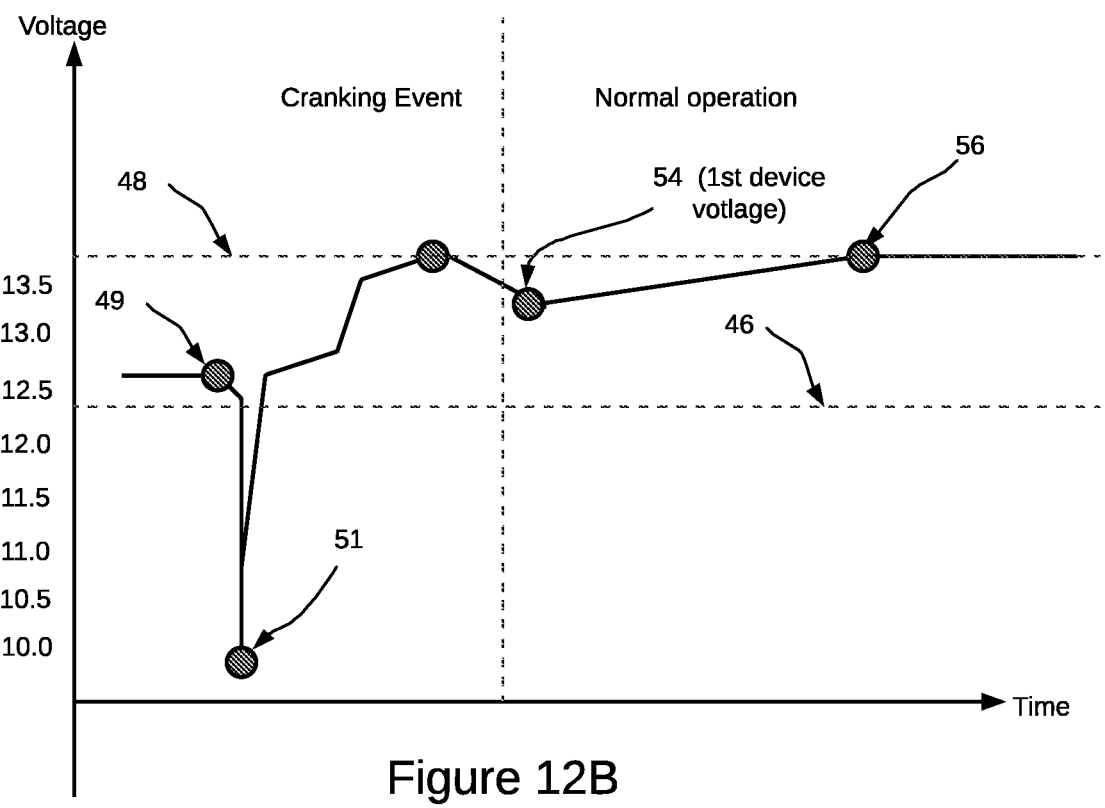
FIG. 12B is a graph depicting cranking and device voltages, and includes cranking and charging thresholds.

FIG. 12B shows the same voltage pattern of FIG. 10, but also depicts two threshold values that are utilized by a telematics device to trigger sampling battery voltage by an ADC to capture voltages of interest.

The first threshold is a cranking threshold 46. The cranking threshold is a voltage threshold that is lower than the open circuit voltage of a battery. It is low enough to determine that a cranking event has started without being too low as to miss a significant part of the cranking event. Cranking event duration and voltage pattern differ from one vehicle to another. As will be discussed below the cranking threshold may be selected based on the vehicle type. In the depicted embodiment, it is desirable to start capturing voltage values at the onset of the cranking event. Assuming an open circuit voltage of 12.6V for a 12V battery, the cranking threshold may be chosen to be around 12.V, 11V, or 10V. The cranking threshold should be chosen such that it is not crossed frequently when peripheral loads are placed on the battery while the vehicle is off. For example, turning on the entertainment system of the air conditioning system should not cause a drop in battery voltage below the selected cranking threshold as this will trigger the telematics device to capture voltages via the voltage monitor and the ADC as will be described below.

The second threshold of interest is the charging threshold. The charging threshold is a voltage level that is high enough above the open circuit battery voltage to cause the battery to charge. For example, for a 12V battery, the charging voltage is at least 1V above the open circuit voltage of 12.6V. In this case, the charging threshold is 13.6V. When the battery voltage exceeds the charging threshold 48, the telematics device may wake-up and begin querying the ECUs 110 knowing that doing so will not drain the battery.

Capturing Battery Voltages in Vehicles of Different Types

Figure 13:
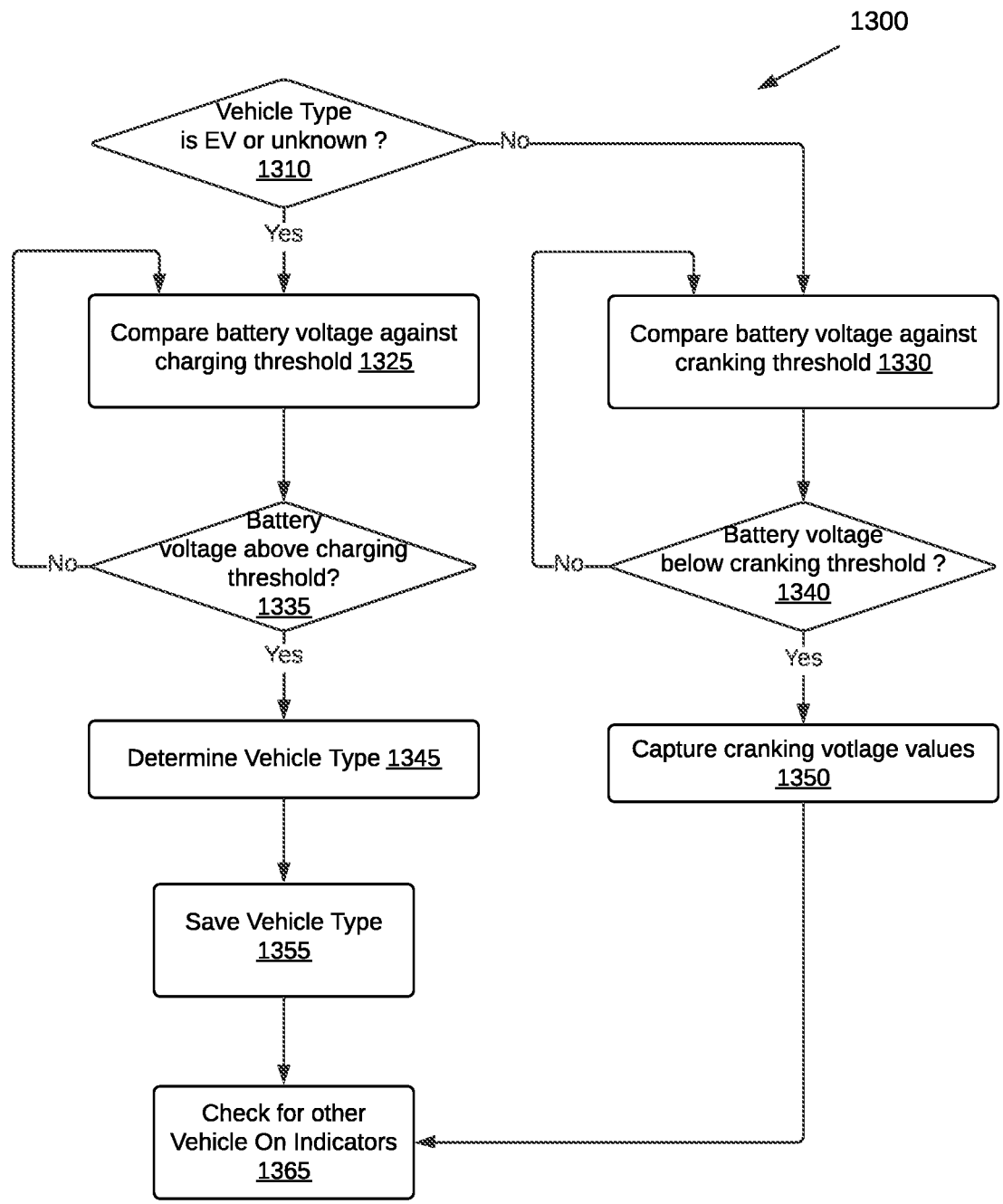
FIG. 13 is a flowchart showing method of configuring a telematics device to detect both cranking and charging events, in accordance with embodiments of the present disclosure.

With reference to FIG. 13, there is provided a method 1300 by a telematics device for capturing battery voltage in a power-efficient manner, depending on the vehicle type to which the telematics device is coupled, in accordance with embodiments of the present disclosure.

The method 1300 is performed by a telematics device connectable to a vehicle via an interface port. The battery voltage is input from the vehicle by the telematics device. As discussed above, the voltage monitor output 1246 carrying the signal V_BATT may be connected to the interface port 102 and is thus accessible as an input to the telematics device. In other implementations the signal V_BATT may be connected to the telematics device directly or via other means. In the steps described below, the telematics device compares the battery voltage to the above-mentioned voltage thresholds namely the cranking threshold and the charging threshold as appropriate based on the vehicle type.

At step 1310 the telematics device checks whether the vehicle type is an EV or is unknown. A vehicle type is unknown if the telematics device has just been plugged into the interface port of the vehicle and has yet to determine the vehicle type. Alternatively, the vehicle type may be known and the vehicle is an EV. If the vehicle type is unknown or is an EV, then control goes to step 1325. Alternatively, if the vehicle type is not EV and is not unknown, control goes to step 1330.

At step 1325, the telematics device compares the input battery voltage against the charging threshold 48. This is described in detail with reference to FIG. 16 below.

At step 1335, if the battery voltage is below the charging threshold 48, then control goes back to step 1325. If the battery voltage is above the charging threshold, then control goes to step 1345.

At step 1345 the telematics device determines the vehicle type. Determining the vehicle type comprises determining whether the vehicle is an ICE-powered vehicle or an EV. Determining the vehicle type may also comprise determining the vehicle's make, model, trim, and year of manufacture. Determining the vehicle type involves querying the vehicle's ECUs in a variety of ways in order to determine the vehicle type.

At step 1355, the determined vehicle type is saved in non-volatile storage.

At step 1365, the telematics device checks for other indicators that may indicate that the vehicle has been turned on and is being driven. For example, the telematics device may check the engine RPM to determine that the engine is running. The telematics device may also query the location module for location information that indicates that the vehicle is in motion. If the vehicle is on and in motion, the battery voltage may be checked periodically by reading the values off an ADC connected to V_BATT. For example, for a running engine, the telematics device periodically checks the battery voltage in real-time, or near real-time. For example, the ADC may be configured to continuously perform ADC conversions of the battery voltage and provide digital values of the battery voltage in real-time. In other implementations, the ADC conversion may be activated by a periodic timer such as every 10 ms or every 100 ms. When the engine is turned off, the telematics device may check the battery voltage using the ADC only during wake-up durations of a power-saving scheme. For example, when the engine of a vehicle is turned off, the telematics device only checks the battery voltage using the ADC during the wake-up durations 422.

As discussed, if the vehicle type is not unknown and is not EV, the vehicle type is likely an ICE vehicle.

At step 1330, the telematics device compares the battery voltage against the cranking threshold. Details of how this is done is described below with reference to FIG. 16.

At step 1340, the telematics device checks whether the battery voltage is below the cranking threshold. If the battery voltage is below the cranking voltage, then control goes to step 1350. If the battery voltage is not below the cranking threshold, then control goes back to step 1330.

At step 1350, the telematics device captures cranking voltage values. In some implementations, the telematics device captures battery voltage values via an ADC connected to the output of the voltage monitor. At the conclusion of the cranking stage, the telematics device checks for other indicators that the vehicle is on by performing step 1365 described above.

Dual Controller Telematics Device

The above-described method that includes detecting whether a vehicle battery voltage is above a charging threshold or below a cranking threshold is implemented by a telematics device. In one implementation, the telematics device uses two controllers. A main controller captures asset information via an asset interface, processes the asset information, and sends telematics data to a remote server. An auxiliary controller is more concerned with input/output (I/O) capabilities and is generally less capable and draws less power than the main controller. This configuration of the telematics device allows the main controller to be in sleep mode per the power-saving scheme of FIG. 4, while allowing the auxiliary controller to wake up more frequently to handle certain I/O events as will be described below.

Figure 14:
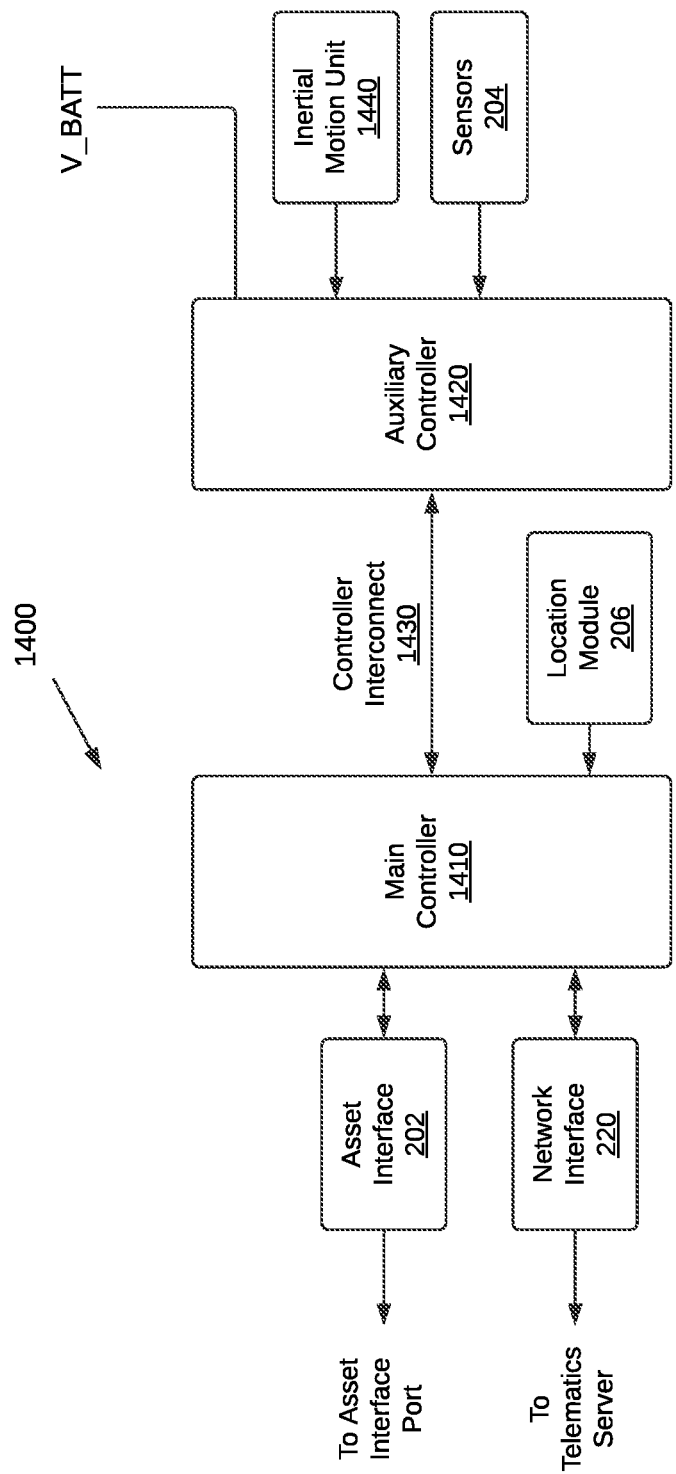
FIG. 14 is a representative block diagram of the internal components of an auxiliary controller.

FIG. 14 is a simplified block diagram of an exemplary telematics device 1400 employing a main controller 1410 and an auxiliary controller 1450. Specifically, the exemplary telematics device 1400 comprises a main controller 1410, an auxiliary controller 1420, an asset interface 202, a network interface 220, sensors 204, a location module 206, and an inertial motion unit (IMU) in the form of IMU 1440.

The main controller 1410 is similar to the controller 230 described above. The main controller 1410 is coupled to the asset interface 202 and the network interface 220 for capturing asset data and sending telematics data to a telematics server.

The auxiliary controller 1420 is generally similar to the controller 230 described above but with some differences. For example, the auxiliary controller includes additional components that are suitable for capturing voltage values as will be described below. The auxiliary controller 1420, when powered-up consumes less power than the main controller 1410. The auxiliary controller 1420 is more suited for capturing inputs from sensors and external peripherals and has less computing power than the main controller 1410. The auxiliary controller 1420 contains internal volatile and non-volatile memory as will be described below.

The main controller 1410 and the auxiliary controller 1420 are connected to one another via a controller interconnect 1430. The controller interconnect 1430 allows data exchange between the main controller 1410 and the auxiliary controller 1420. In some implementations, the controller interconnect uses a serial bus such as Universal Asynchronous Receiver Transmitter (UART), Serial Peripheral Interface (SPI), Secure Digital Input/Output (SDIO), Integrated-Integrated Circuit (I2C), Peripheral Component Interconnect (PCI), or any other suitable interface technology. Additionally, the controller interconnect 1430 includes a wake-up signal line allowing the auxiliary controller 1420 to wake up the main controller 1410, if needed.

The asset interface 202, network interface 220, sensor 204, and location module 206 have been described above.

The IMU 1440 is a combination of sensors for detection motion such as accelerometers and gyroscopes.

Initial Connection and Configuration

Figure 15:
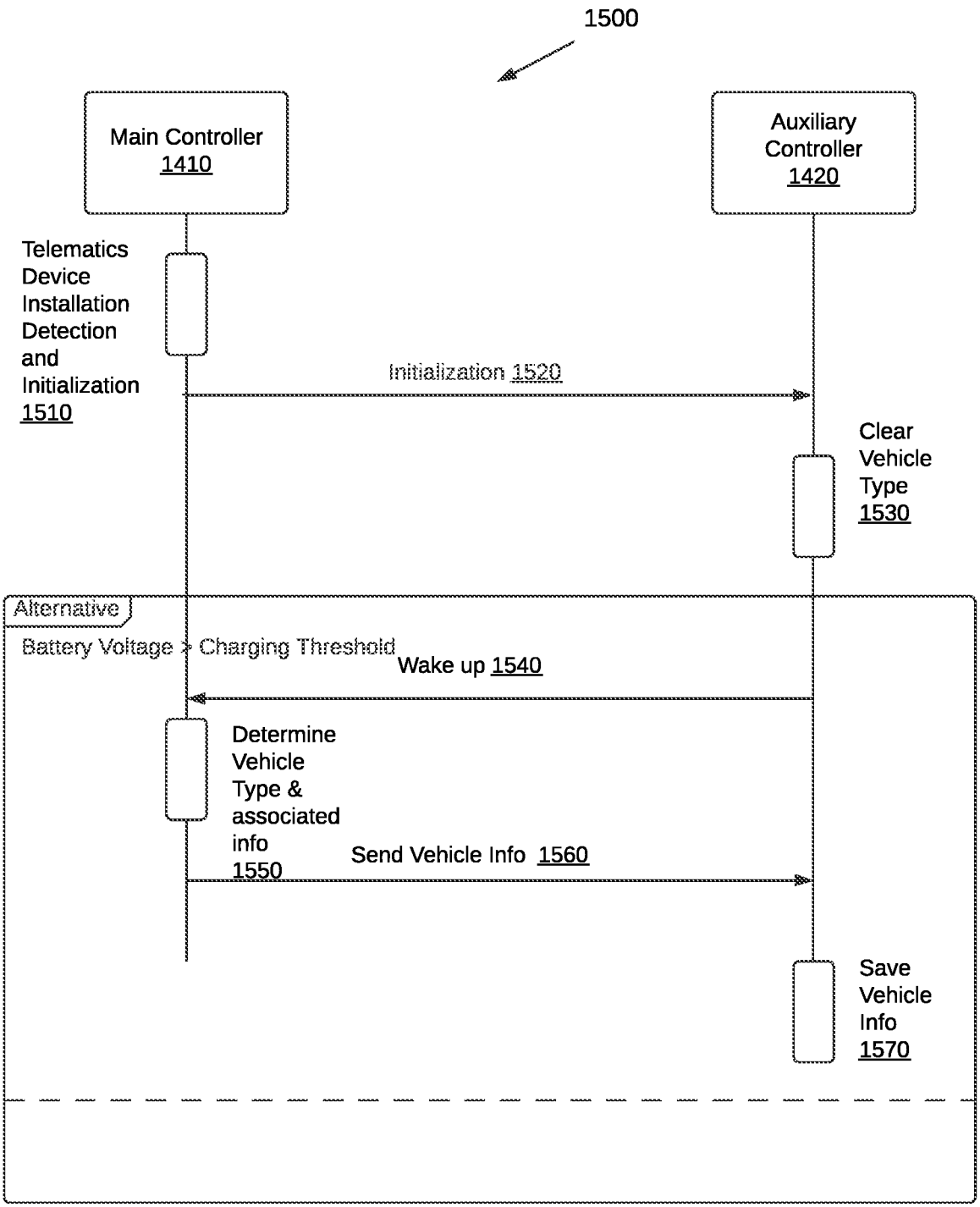
FIG. 15 is a message sequence diagram depicting events and actions by the telematics device upon a new device installation in an asset, in accordance with embodiments of the present disclosure.

When a telematics device is first connected to an asset, such as a vehicle, the telematics device performs some initialization in response to detecting that the telematics device has been newly installed in a vehicle. FIG. 15 is a message sequence diagram that depicts a method 1500 for initialization of the telematics device and for determining the vehicle type in which the telematics device is installed.

The method 1500 begins at step 1510 in which the telematics device detects a new installation. Step 1510 is performed by the main controller 1410. For example, when a telematics device is first plugged into a vehicle, a boot code is executed by the main controller 1410 when the telematics device is powered up. The boot code performs some initialization steps. For example, since the telematics device is a newly installed device, the vehicle type of the vehicle in which the telematics device is installed is not known. In accordance with the method 1300 of FIG. 13, this configures the telematics device to check whether the battery voltage is above the charging threshold.

At step 1520, the main controller 1410 sends at least one initialization message, over the controller interconnect 1430, to the auxiliary controller 1420. The initialization message is received by the auxiliary controller 1420.

At step 1530, in response to receiving the initialization message, the auxiliary controller 1420 clears any saved vehicle type and to check whether the battery voltage has exceeded the charging threshold. The mechanism by which the auxiliary controller 1420 detects that the battery voltage has exceeded the charging threshold will be described below. It should be noted that when the vehicle type is not known, the auxiliary controller 1420 uses a default charging threshold for detecting whether the vehicle is in a condition in which the ECUs can be queried for vehicle type determination.

If the battery voltage is greater than the charging threshold, at step 1540 the auxiliary controller 1420 sends a wake-up signal to the main controller 1410. In some implementations, the wake-up signal is an interrupt signal line that is part of the controller interconnect 1430. In other implementations, the wake-up signal line is a separate interrupt signal line. The auxiliary controller 1420 asserts the interrupt signal line. The main controller 1410 is configured to wake-up from sleep mode in response to detecting the assertion of the interrupt signal line. The wake-up interrupt is one of: an active high signal, an active low signal, a rising edge signal, and a falling edge signal.

In response to receiving the wake-up interrupt signal from the auxiliary controller 1420, at step 1550 the main controller 1410 wakes up from sleep and determines the vehicle type and other associated information, such as the charging threshold and cranking threshold (if the vehicle type indicates that the vehicle is an ICE vehicle). To determine the vehicle type, the main controller 1410 queries the ECUs 110 by sending requests thereto and analyzing responses therefrom. When the vehicle type is determined, the main controller may also determine information associated with the vehicle type. For example, the charging threshold and the cranking threshold may vary from one vehicle type to another. The main controller 1410 or a non-volatile memory associated therewith may contain a table storing the cranking threshold and the charging threshold for a plurality of vehicle types. In some implementations, the main controller 1410 queries the table by the vehicle type and determines the charging threshold and the cranking threshold for the determined vehicle type. In some implementations, the main controller 1410 communicates with a remote server, such as the telematics server 130 and requests the charging threshold and the cranking threshold for the determined vehicle type.

When the main controller 1410 determines the vehicle information including the vehicle type and other associated information such as the charging and cranking thresholds, at step 1560 the main controller 1410 sends the vehicle information to the auxiliary controller 1420.

In response to receiving the vehicle type, at step 1570 the auxiliary controller saves the vehicle information in a persistent storage thereof.

Voltage Detection Subsystem

As discussed above, based on the vehicle type, the telematics device needs to detect when the battery voltage has risen above or dropped below two different voltages, namely the cranking voltage and the charging voltage. One possible arrangement is to periodically sample an ADC coupled to the output signal V_BATT of the voltage monitor. However, as discussed, having the ADC periodically and continually measuring the battery voltage is wasteful when the vehicle is parked and there are no changes in the battery voltage. Another possible solution is to use analog comparators. For example, the output signal V_BATT may be connected to two analog comparators. One comparator may be configured to compare the battery voltage to the cranking threshold and provide a change in the output when the battery voltage drops below the cranking threshold. The other comparator may be configured to compare the battery voltage to the charging threshold and provide a change in the output when the battery voltage rises above the charging threshold. For configuring each comparator to a specific threshold a DAC is used to provide a reference voltage to one of the comparator inputs. Using two comparators and two DACs is inefficient and requires additional components or an auxiliary controller 1420 with additional peripherals.

Figure 16:
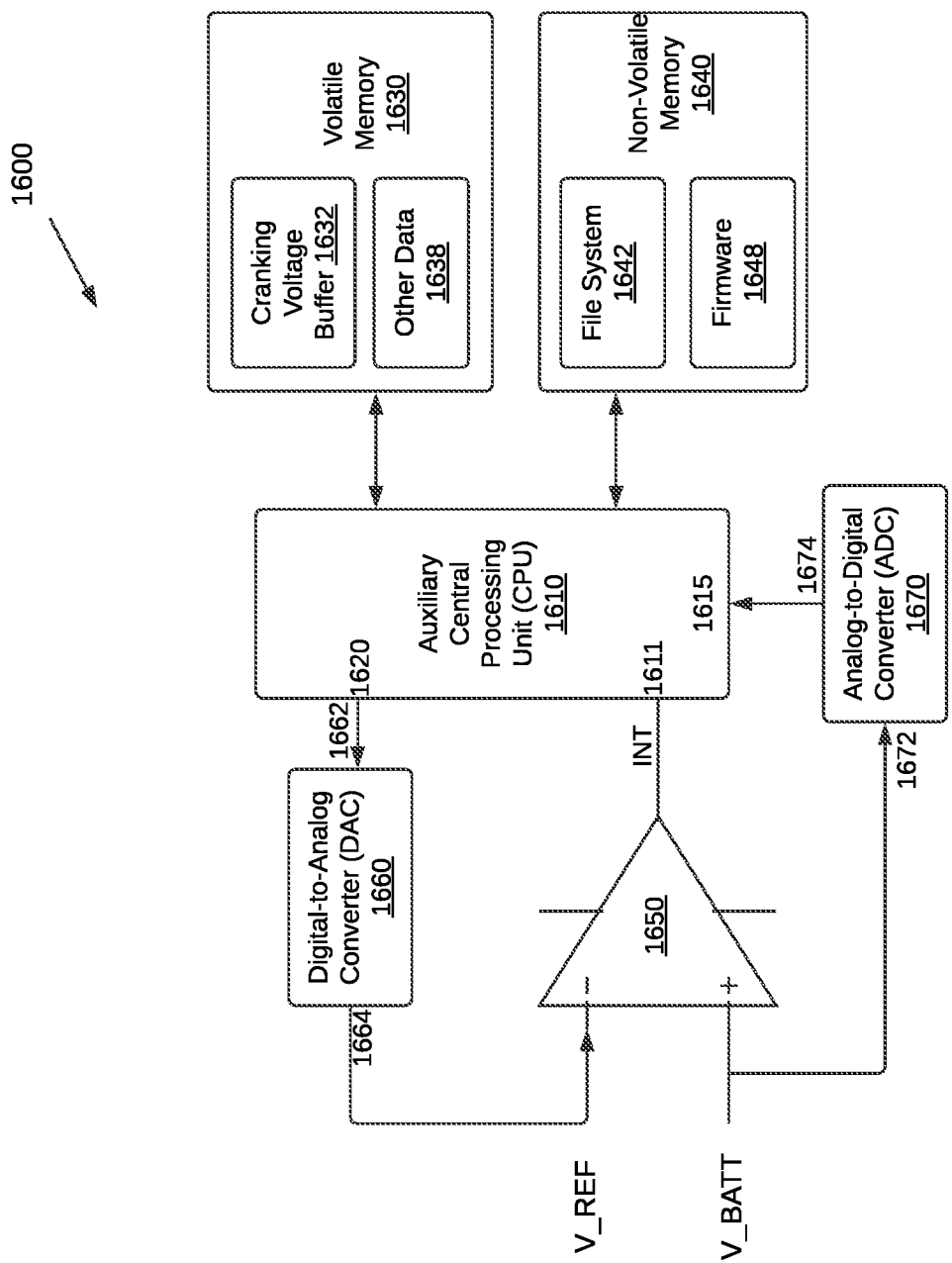
FIG. 16 is a simplified block diagram depicting a configuration of an auxiliary controller of a telematics device for detecting charging and cranking events, in accordance with embodiments of the present disclosure.

The inventor has come up with a design that allows detecting when the battery voltage has either exceeded the charging threshold or dropped below the cranking threshold with the same components. To illustrate, reference is made to FIG. 16. FIG. 16 depicts a simplified block diagram of an exemplary implementation of the auxiliary controller 1420.

The auxiliary controller 1420 has an auxiliary CPU 1610, a volatile memory 1630, a non-volatile memory 1640, an analog comparator 1650, a digital-to-analog converter (DAC) 1660, and an ADC 1670. Other components of the auxiliary controller 1420 are not shown for brevity.

The auxiliary CPU 1610 is a central processing unit as known in the art. The CPU 1610 has a plurality of pins. In this context a pin is a logical object that routes a signal to the core of the CPU or out of the core of the CPU. Since the components of the auxiliary controller 1420 are all internal to a single chip, the term "pin" does not mean a physical pin such as the ones used in dual-inline packages (DIP) or other integrated circuits. Each pin may be configurable as an input pin or as an output pin. Some pins may be configured to generate an interrupt on change in the logic of the input thereto. For example, the signal line connected to the pin 1611 is labeled "INT" to indicate that it is an interrupt signal. The pin 1611 may be configured to generate an interrupt event when the signal INT has a logic transition from a logic LOW state to a logic HIGH state, from a logic HIGH state to a logic LOW state, becomes HIGH, or becomes LOW. For the purpose of this application, we assumed that the interrupt is edge-triggered and therefore generates an interrupt when the INT signal has a logic transition from a logic LOW state to a logic HIGH state or from a logic HIGH state to a logic LOW state. Other pins are used to communicate with other peripherals within the auxiliary controller. For example the pins 1615 represents a plurality of pins that are configured as input pins and receive the digital output 1672 of the ADC 1670. The output pins 1620 are configured as output pins and used to send out a digital voltage for conversion into an analog voltage by the DAC 1660. The auxiliary CPU 1610 is connected to the volatile memory 1630 and the non-volatile memory via a memory bus. In some implementations, memory bus is common to both the volatile and the non-volatile memory. In other implementations the volatile memory uses a different bus than that used by the non-volatile memory.

The non-volatile memory 1640 is a memory module that uses non-volatile technology to store data even when power is disconnected therefrom. Examples of non-volatile memory include, but not limited to, flash memory, Electrically Erasable Programmable Read Only Memory (EEPROM), and the like. The non-volatile memory 1640 may store the firmware 1648 comprising machine-executable programming instructions for execution by the auxiliary CPU 1610 to perform some of the steps of the methods described herein. The non-volatile memory 1640 may also store data in a file system 1642. Examples of data stored in the file system 1642 include a stored vehicle type and related information, the cranking threshold, and the charging threshold.

The volatile memory is a memory module that uses volatile technology to store data. The stored data in the volatile memory is erased when power is disconnected therefrom. Examples of the volatile memory include, but are not limited to, Static Random Access Memory (SRAM) and Dynamic Random Access Memory (DRAM). The volatile memory 1630 has a cranking voltage buffer 1632 for storing sample cranking voltage values. It also stores other data 1638.

The ADC 1670 converts battery voltages from the output of the voltage monitor, namely the signal V_BATT, to digital values representative of the battery voltage of the vehicle in which the telematics device is installed. Accordingly, the ADC 1672 has an analog input 1672 connected to the output of the voltage monitor, and has a digital output connected to the input pin 1615 of the CPU 1610.

The DAC 1660 converts digital values representing the charging threshold or the cranking threshold to analog voltages that are used as the reference voltage for the analog comparator 1650. The DAC 1660 has a digital input 1662 connected to the output pin 1620 of the CPU 1610 for receiving a digital value corresponding to the charging threshold or to the cranking threshold from the CPU 1610. The DAC 1660 has an analog output 1664 connected to the inverting input V− of the analog comparator 1650 for providing a threshold voltage as a reference voltage with which the analog comparator 1650 compares the signal V_BATT.

The analog comparator 1650 compares the signal V_BATT which represents the battery voltage with the cranking threshold or the charging threshold and generates an output indicative of the comparison. In some implementations, the analog comparator 1650 is implemented as an operational amplifier ("op amp"). In the depicted implementation, the analog comparator 1650 is a non-inverting comparator in which the input voltage is connected to the non-inverting input (V+) while the reference voltage V_REF is connected to the inverting input (V−). The reference voltage V_REF may represent the charging threshold or the cranking threshold as described below.

The auxiliary controller 1420 depicted in FIG. 16 carries out some of the steps of the method 1300 of FIG. 13. The steps of FIG. 13 are described with reference to FIG. 16.

At step 1310, the auxiliary controller 1420 checks whether the vehicle type is EV or is an unknown type. Specifically, the auxiliary controller 1420 checks the file system 1642 for stored information related to the vehicle type of the vehicle in which the telematics device is installed. As indicated in FIG. 15, step 1530, when there is a new installation in a new vehicle, the initialization code causes the vehicle type to be erased from the file system 1642. As such, if the telematics device is in a new vehicle the vehicle type is unknown. Alternatively, the vehicle is an EV and the vehicle type stored in the file system 1642 indicates so. In both cases, the method 1300 proceeds to step 1325.

At step 1325, the auxiliary controller 1420 compares the battery voltage against the charging threshold. If the vehicle type is unknown, the battery voltage is compared against a default charging threshold. The auxiliary CPU 1610 outputs a digital value corresponding to the default charging threshold on the output pins 1620. It should be noted that since the voltage monitor signal V_BATT is a scaled signal corresponding to the battery voltage, then the digital value corresponding to the default charging threshold is also scaled in the same manner as V_BATT. The digital value output on the output pins 1620 are converted by the DAC 1660 into an analog signal that is used as the reference voltage of the analog comparator 1650. The interrupt pin 1611 is configured by the auxiliary CPU 1610 as a rising edge interrupt.

At step 1335, if the signal V_BATT rises above the charging threshold applied to V– as the V_REF signal, the output of the comparator, i.e., the INT signal, has a rising edge transition from LOW to HIGH. The rising edge transition from LOW to HIGH triggers an interrupt with the auxiliary CPU 1610. The interrupt indicates that the battery is being charged and the vehicle's ECUs may be queried for the vehicle type. As described in step 1540 of FIG. 15, the auxiliary controller sends a wake-up signal to the main controller.

At step 1345, the telematics device determines the vehicle type. The main controller determines the vehicle type by querying the ECUs and obtains associated information. For example, the main controller 1410 may send messages over the network interface 220 to the telematics server 130 indicating the detected vehicle type and requesting either a charging threshold (if the type is EV) or a cranking threshold (if the type is ICE). The main controller 1410, receives the information from the telematics server 130.

At step 1355, the vehicle type and the other information are saved. Specifically, the main controller 1410 sends the vehicle type and associated information to the auxiliary controller 1420 over the controller interconnect. The auxiliary controller saves the vehicle type and associated information in the file system 1642.

At step 1365, the telematics device checks for one or more other indicators that may indicate that the vehicle is on, such as motion detected by the IMU, or by other indicators obtained by querying the ECUs.

If, at step 1310, the vehicle type was not unknown and was not an EV, control goes to step 1320 as discussed above. If the vehicle is an ICE vehicle, then control goes to step 1330.

At step 1330, the auxiliary controller compares the battery voltage against the cranking threshold. Specifically, the auxiliary CPU 1610 reads the cranking voltage threshold from the file system 1642 in the non-volatile memory 1640. The auxiliary CPU 1610 outputs the cranking threshold on the output pins 1620 to the DAC 1660. The DAC 1660 converts the cranking threshold to a reference voltage V_REF that is output to the inverting input of the analog comparator 1650. Prior to cranking, V_BATT is higher than V_REF. As a result, the output of the analog comparator is HIGH (since V+>V–). The auxiliary CPU 1610 configures the interrupt pin 1611 to be a falling edge interrupt.

At step 1340 when cranking begins, the battery voltage V_BATT drops below the cranking threshold (V_REF). As a result, the output of the analog comparator 1650 drops to LOW. Since the pin 1611 is an interrupt pin which is configured for HIGH to LOW falling edge transitions (i.e., configured as a falling edge interrupt), then an interrupt is generated at the auxiliary CPU 1610.

In response to the generated interrupt, the auxiliary controller 1420 starts capturing the battery voltage V_BATT, via the ADC 1670, and stores the battery voltage values in the cranking voltage buffer 1632 in the volatile memory 1630. In some embodiments, the auxiliary controller 1420 also stores the cranking voltage values in the file system 1642 in the non-volatile memory 1640.

In some implementations, in response to the generated interrupt, the auxiliary controller 1420 wakes up the main controller 1410.

Subsequent to storing the cranking voltages, the auxiliary controller 1420 sends the cranking voltages to the main controller 1410 for sending to a remote server, such as the telematics server 130, via the network interface 220.

Capturing Cranking Voltages

As discussed above, in response to detecting that the battery voltage has dropped below the cranking threshold, the auxiliary controller 1420 captures a plurality of cranking voltages. When cranking is concluded, the auxiliary controller 1420 sends all buffered cranking voltage values to the main controller 1410.

The manner in which the auxiliary controller captures and buffers the cranking voltage values may be time-based or voltage-based.

Figure 17:
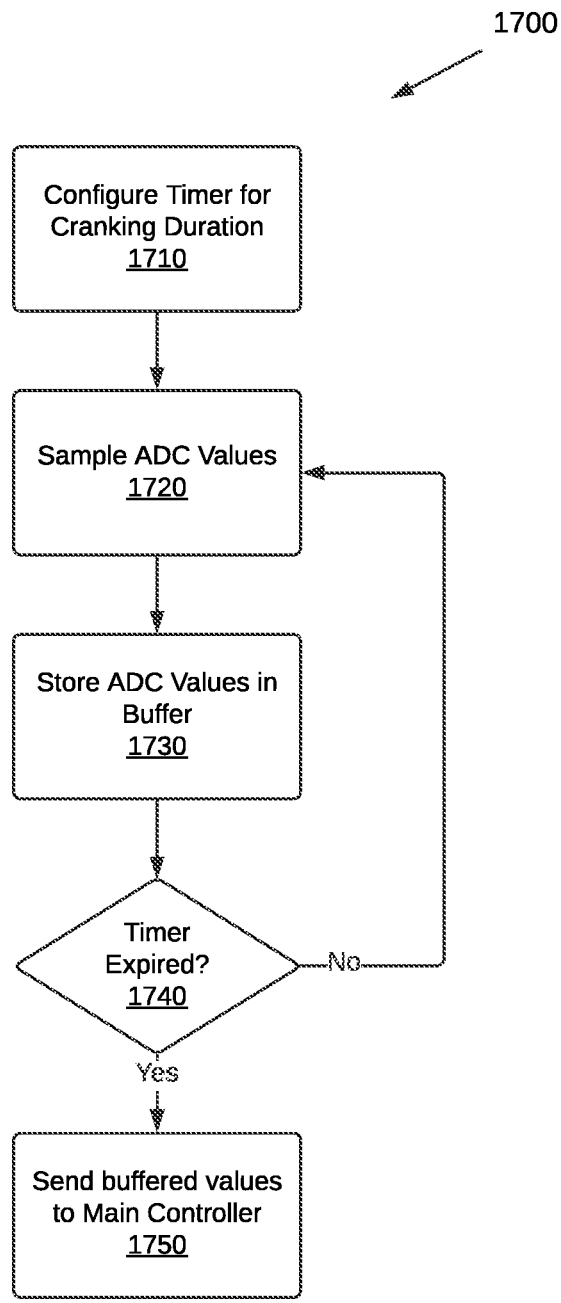
FIG. 17 is a flowchart depicting a method of sampling cranking voltages, in accordance with embodiments of the present disclosure.

FIG. 17 depicts a time-based method 1700 for capturing and buffering cranking voltage values, in accordance with embodiments of the present disclosure. The time-based method 1700 may be performed by the auxiliary controller 1420.

At step 1710, the auxiliary controller configures a timer to expire after a predetermined cranking duration has elapsed. The timer may be a hardware timer or a software timer. For example, the auxiliary controller 1420 may configure a timer to expire after 5 seconds or 10 seconds. The cranking duration selected may depend on the vehicle type and may be provided to the auxiliary controller by the main controller. The main controller may, in turn, have received the cranking duration for the vehicle type from the telematics server 130.

At step 1720, the auxiliary controller begins sampling the voltage values output by the ADC 1670. The sampling rate depends on the desired accuracy of the cranking voltage curve. For example, the sampling rate chosen may be every 10 ms or every 100 ms. The higher the rate, the more voltage values representing the cranking voltage are stored in the cranking voltage buffer 1632. As such, the accuracy should be balanced against the buffer size and volatile memory size. Additionally, the more cranking voltage values stored, the more data has to be sent to the main controller for sending to the telematics server.

At step 1730, at least one sampled voltage value is stored in a buffer, such as the cranking voltage buffer 1632.

At step 1740, the timer is checked. In some implementations, the timer has a register and the auxiliary CPU 1610 checks whether the timer register has reached 0 as the timer counts down from the cranking duration down to 0. In other implementations, the timer generates an interrupt when it decrements to 0 and the auxiliary CPU 1610 then determines that the timer has expired as result of the generated interrupt. If the timer has not expired, control goes back to step 1720 and another ADC value representing the battery voltage is captured. If the timer has expired, then control goes to step 1750.

At step 1750, the auxiliary controller sends the buffered ADC values representing the cranking voltage to the main controller.

Figure 18:
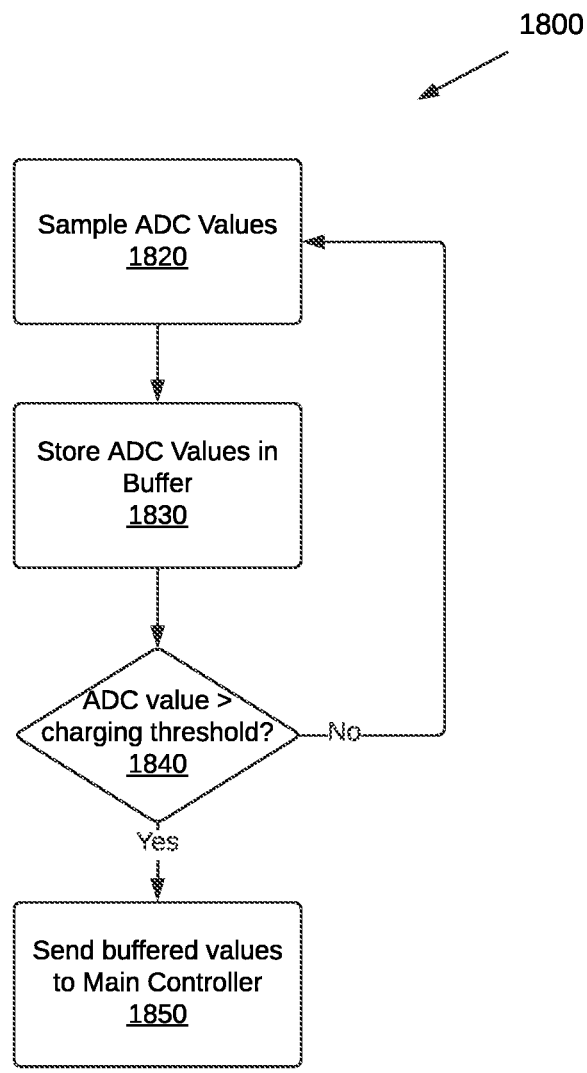
FIG. 18 is a flowchart depicting another method of sampling cranking voltages, in accordance with embodiments of the present disclosure.

FIG. 18 depicts a threshold-based method for capturing cranking voltage values, in accordance with another embodiment of the present disclosure. The threshold-based method is based on the assumption that when the battery voltage rises up to the charging threshold after being in the cranking phase, then that is an indication of the conclusion of the cranking phase. For example, with reference to FIG. 12B, when the battery voltage rises to the charging threshold

48, this is an indication that the majority of the cranking voltage changes have been concluded. The method begins at step 1820.

At step 1820, the auxiliary controller 1420 samples the ADC values in the same manner as step 1720.

At step 1830, the sampled ADC values are stored in a buffer, such as the cranking voltage buffer 1632.

At step 1840, if the battery voltage rises above the charging threshold, the method proceeds to step 1850. If the battery voltage is still below the charging threshold, control goes back to step 1820 where more ADC values representing the battery voltage are sampled.

At step 1850, the buffered values are sent to the main controller, similar to step 1750 above.

After the conclusion of cranking and sending the buffered ADC values to the main controller, the auxiliary controller stops sampling the ADC values and powers down the ADC. Periodically, to check the health of the battery, the main controller wakes up and directs the auxiliary controller to read the battery voltage and check it against a brownout value.

Embodiments have been described where the techniques are implemented in circuitry and/or computer-executable instructions. It should be appreciated that some embodiments may be in the form of a method or process, of which at least one example has been provided. The acts performed as part of the method or process may be ordered in any suitable way. Accordingly, embodiments may be constructed in which acts are performed in an order different than illustrated, which may include performing some acts simultaneously, even though shown as sequential acts in illustrative embodiments. Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The invention claimed is:

1. A method in a telematics device coupled to a vehicle including a battery, the method comprising:
   determining that a vehicle type of the vehicle is one of: an electric vehicle (an EV), an internal combustion engine vehicle (an ICEV), and an unknown type;
   in response to determining that the vehicle type is an unknown type or is an EV:
      comparing, by a comparator, a battery voltage of the battery, with a charging threshold;
      in response to determining that the battery voltage is above the charging threshold:
         when the vehicle type is an unknown type:
            querying the vehicle for the vehicle type;
            saving the vehicle type;
            obtaining telematics data from the vehicle, and sending the telematics data to a remote server;
   in response to determining that the vehicle type is an ICEV:
      comparing, by the comparator, the battery voltage with a cranking threshold;
      in response to determining that the battery voltage is below the cranking threshold:
         capturing a plurality of cranking voltage values;
         checking for at least one indicator that indicates that the vehicle is turned on; and
         in response to determining that the vehicle is turned on, obtaining telematics data from the vehicle, and sending the telematics data to a remote server.

2. The method of claim 1, wherein determining that the vehicle type is one of: an EV, an ICEV, and an unknown type comprises checking a stored vehicle type in a non-volatile storage of the telematics device.

3. The method of claim 1, wherein
   determining that the vehicle type is an unknown type or is an EV comprises determining that the vehicle type is an unknown type; and
   the charging threshold comprises a default charging threshold.

4. The method of claim 1, wherein:
   determining that the vehicle type is an unknown type or is an EV comprises determining that the vehicle type is EV; and
   the charging threshold comprises an EV charging threshold.

5. The method of claim 1, wherein the battery voltage is represented by a voltage monitor output of a voltage monitor coupled to the battery.

6. The method of claim 5, wherein the voltage monitor output is connected to a first input of the comparator.

7. The method of claim 6, wherein comparing the battery voltage with the charging threshold comprises:
   outputting, by a processing unit, a digital signal corresponding to the charging threshold to a digital-to-analog converter (DAC) for converting the digital signal to an analog signal corresponding to the charging threshold;
   outputting the analog signal of the DAC to a second input of the comparator; and
   configuring the processing unit to generate a first interrupt event upon detecting a first logic transition in an output of the comparator.

8. The method of claim 7, wherein the first input comprises a non-inverting input, and the second input comprises an inverting input.

9. The method of claim 7, wherein the first logic transition comprises one of:
   a logic transition from a logic low state to a logic high state; and
   a rising edge transition.

10. The method of claim 7, wherein the first input comprises an inverting input, and the second input comprises a non-inverting input.

11. The method of claim 10, wherein the first logic transition comprises one of:
   a logic transition from a logic low state to a logic high state; and
   a rising edge transition.

12. The method of claim 7, wherein determining that the battery voltage is above the charging threshold comprises detecting the first interrupt event.

13. The method of claim 1, wherein querying the vehicle for the vehicle type comprises querying at least one electronic control unit (ECU) of the vehicle.

14. The method of claim 1, wherein determining that the vehicle type is an ICEV comprises checking a stored vehicle type in a non-volatile storage of the telematics device.

15. The method of claim 6, wherein comparing the battery voltage with the cranking threshold comprises:
   outputting, by a processing unit, a digital signal corresponding to the cranking threshold to a digital-toanalog converter (DAC) for converting the digital signal to an analog signal corresponding to the charging threshold;

outputting the analog signal from the DAC to a second input of the comparator; and configuring the processing unit to generate a second interrupt event upon detecting a second logic transition in an output of the comparator.

16. The method of claim 15, wherein the second logic transition comprises one of:

a transition from a logic high state to a logic low state; and a falling edge transition.

17. The method of claim 15, wherein determining that the battery voltage is below the cranking threshold comprises detecting the second interrupt event.

18. The method of claim 5, wherein capturing the plurality of cranking voltage values comprises sampling a digital output of an analog-to-digital converter (ADC) having an analog input coupled to the voltage monitor output.

19. The method of claim 18, wherein sampling the digital output is done for a predetermined cranking duration.

20. The method of claim 18, wherein sampling the digital output is done until a sampled voltage value of the digital output is greater or equal to the charging threshold.

* * * * *